(12) United States Patent
Jarron

(10) Patent No.: US 7,183,555 B2
(45) Date of Patent: Feb. 27, 2007

(54) CHARGE OR PARTICLE SENSING

(75) Inventor: Pierre Jarron, Saint Julien en Genevois (FR)

(73) Assignee: European Organization for Nuclear Research, Geneva (CH)

( * ) Notice: Subject to any disclaimer, the term of this patent is extended or adjusted under 35 U.S.C. 154(b) by 261 days.

(21) Appl. No.: 10/500,794

(22) PCT Filed: Jan. 20, 2003

(86) PCT No.: PCT/EP03/00603

§ 371 (c)(1),
(2), (4) Date: Dec. 30, 2004

(87) PCT Pub. No.: WO03/061277

PCT Pub. Date: Jul. 24, 2003

(65) Prior Publication Data

US 2005/0104003 A1 May 19, 2005

(30) Foreign Application Priority Data

Jan. 21, 2002 (GB) ................................. 0201260.7

(51) Int. Cl.
*G01T 1/24* (2006.01)
(52) U.S. Cl. ................................. 250/370.01
(58) Field of Classification Search ............ 250/370.01
See application file for complete search history.

(56) References Cited

U.S. PATENT DOCUMENTS

| | | | |
|---|---|---|---|
| 4,555,623 A | 11/1985 | Bridgewater et al. | |
| 4,866,400 A * | 9/1989 | Britton et al. | 330/305 |
| 5,057,682 A | 10/1991 | Michon et al. | |
| 5,602,511 A | 2/1997 | Woolaway | |
| 5,606,277 A | 2/1997 | Feliz | |
| 5,981,936 A | 11/1999 | Fujiie | |
| 6,274,869 B1 * | 8/2001 | Butler | 250/338.1 |
| 6,329,881 B1 | 12/2001 | Tachigori | |
| 6,759,658 B2 * | 7/2004 | Overdick et al. | 250/336.1 |
| 2004/0094720 A1 * | 5/2004 | Dagan et al. | 250/370.12 |
| 2006/0138333 A1 * | 6/2006 | Nascetti et al. | 250/370.09 |

FOREIGN PATENT DOCUMENTS

DE 19838693 A1 3/2000

* cited by examiner

*Primary Examiner*—David Porta
*Assistant Examiner*—Christopher Webb
(74) *Attorney, Agent, or Firm*—Hamilton, Brook, Smith & Reynolds, P.C.

(57) ABSTRACT

A sensing arrangement for sensing charged particles and/or quanta of electromagnetic radiation has a sensor device (12) and amplifier circuitry (14). The sensor device (12) provides a sensor signal to an imput mode (vin) of the amplifier (14) to cause the level at the amplifier output mode (vout) to change. A negative feetback device (T1) responds to the change in level of the output node (Vour) to vary the feedback effect to increase the loop again of said amplifier circuitry (14). A current mirror (T2,T3) resets the input node (vin) to its initial level. Single particle and integrating sensor arrangements are disclosed.

30 Claims, 14 Drawing Sheets $$ENCp = \left[\frac{1}{q}\right] \cdot \sqrt{2 \cdot k \cdot T \cdot (gmf+gmi) \cdot Tm}$$

CHARGE OR PARTICLE SENSING

RELATED APPLICATIONS

This application is the U.S. National Stage of International Application No. PCT/EP2003/000603, filed Jan. 20, 2003, published in English, and claims priority under 35 U.S.C. 119 or 365 to Great Britain Application No. 0201260.7, filed Jan. 21, 2002.

FIELD OF THE INVENTION

The invention relates to a sensing arrangement, a detection system, a macropixel and a method of detecting the arrival of one or more charged particles and/or one or more quanta of electromagnetic radiation.

BACKGROUND OF THE INVENTION

Conventional pixel radiation sensors are often based on a hybrid approach in which an electronic circuit is bump bonded to a pixel sensor.

There are a number of types of conventional semiconductor imagers and sensors. One class is based on a hybrid pixel sensor arrangement for two-dimensional single particle detection, or single photon detection. Another class uses monolithic active pixel sensors (APS) that are solid state imagers that provide, for each pixel, radiation-sensing, charge-to-voltage conversion, and a reset function.

The hybrid pixel sensor arrangement is mainly used for IR focal planes, Silicon Pixel arrays for single particle detection, X-ray detection and medical imaging. The hybrid pixel sensor permits independent optimisation of the radiation detector characteristics and the pixel readout electronics because they are fabricated on two separate substrates with two different processes. However, this type of pixel sensor has a limit to the minimum achievable pixel dimensions due to the bump bonding technique. So far 50 µm×50 µm has been achieved, but it is expensive and complex to fabricate. Moreover, the hybrid pixel sensor has an input capacitance (100 fF to 200 fF) sufficiently high to limit the operation and noise performance.

Monolithic APS devices are mainly used for visible light imaging together with CCD imagers, but have also been applied for single particle detection. Known monolithic APS devices employ a floating diffusion as a pixel sensor in the form of an n-diffusion/n-well in p-doped silicon substrate, a photo-gate, or a PIN diode formed in amorphous Si:H deposited above the integrated circuit. In these devices, the pixel signal current is integrated using the input capacitance during an integrating time period of a few milliseconds. The integrated current is read out by a source follower MOSFET transistor F1 as shown in FIG. 1 (prior art). Pixel select transistor F3 switches the output of the pixel to a common load F4. The floating node which comprises the junction of the gate of the source follower MOSFET transistor F1, the pixel sensor and the drain of F2, is sequentially reset by a reset MOSFET transistor F2. This has the disadvantage of generating kTC or reset noise far above the intrinsic electronic noise of the amplifier stage. Furthermore, the device shown in FIG. 1 is not capable of discriminating between incident quanta (hits) during the integration period.

For single charged particle detection, the conventional monolithic APS uses, as the sensor element, an 8–12 ohm epitaxial layer of the silicon wafer used in standard commercial CMOS technologies, the layer being a few microns thick. The charge signal collected is, for example, of the order of 80 e– for a minimum ionising charged particle traversing a 1 µm thick silicon layer. A major drawback of the conventional bulk silicon sensor is that charge collection is achieved by thermal diffusion of carriers. This intrinsically limits carrier velocity and thus charge collection is slow> Charge collection is also spread over adjacent pixels and not complete.

For single photon detection using an integrated APS with an avalanche gain of, for example, 50, the collected charge per photon may be 50 e–. For such very low signal levels, conventional APS architecture is only marginally usable, if at all, as the signal-to-noise ratio required to detect one visible photon, one X-ray or one charged particle is desirably at least 10 to minimise background noise. This requires a noise floor below 5 e– rms, which cannot be achieved by the conventional APS integrating architectures. These architectures have a conversion gain in the order of 20 µV/e– and a reset noise level of greater than 10 e– rms.

Moreover, the integrating APS architecture of conventional devices cannot measure the timing of particle events, and cannot digitally count each incoming charged particle or X-ray or visible photon. Conventional circuit architectures for hybrid pixel radiation sensors are generally too large, typically, at best 50 µm×50 µm, and consume too much power, for example 30 to 50 µW, and are consequently not usable for monolithic integration of high density pixel sensors with quantum detection capability. The applicant is not aware of circuitry able to process the very low signals required for Single Particle/Photon Detection and imaging (SPD) in monolithic integrated circuits.

The present invention aims to substantially overcome or ameliorate one or more of the aforementioned problems.

In particular, embodiments of the present invention address problems of monolithic integration of active silicon pixels in commercial deep submicron CMOS technologies. Embodiments aim to achieve single particle detection, spatial localisation of single charged particle tracks and single photon detection in contrast to conventional APS designs which integrate the sensor signal current over a certain integrating time period.

SUMMARY OF THE DISCLOSURE

According to a first aspect of the present invention there is provided a sensing arrangement having a sensor device and amplifier circuitry, the sensor device being constructed and arranged to provide a sensor signal when it receives or one or more charged particles and/or one or more quanta of electromagnetic radiation, the amplifier circuitry having an input node and an output node, the sensor device being connected to said input node for supplying said signal thereto whereby the level at the output node changes, and further having feedback circuitry connecting said input node and said output node for feeding back a portion of the level at the output node for maintaining a first level at the output node in the absence of a said signal from said sensor device, the feedback device being responsive to the change in level of said output node to vary the effect of said feedback circuitry when said level changes to increase the loop gain of said amplifier circuitry.

According to a second aspect of the invention there is provided a sensing arrangement having a sensor device and amplifier circuitry, the sensor device being constructed and arranged to provide a sensor signal when it receives or one or more charged particles and/or one or more quanta of electromagnetic radiation, the amplifier circuitry having an input node and an output node, the sensor device being connected to said input node for supplying said signal thereto whereby the level at the input node changes and causes an output signal from said output node, the arrangement further comprising a current mirror connected to said input node and constructed and arranged to supply current thereto for restoring the level at the input node to a starting level.

According to the present invention in a further aspect there is provided a sensing device comprising a sensor for detecting arrival of an incident quantum of electromagnetic radiation and/or charged particles, and an amplifier connected to the sensor for amplifying a signal from the sensor, wherein the sensor and the amplifier are fabricated on a common substrate, the sensing device being arranged to discriminate between the arrival of single or multiple incident quanta at the sensing device.

The sensor and the amplifier may be diffused onto the common substrate, or are deposited on the common substrate. The sensing device may be a pixel cell. The substrate may comprise a monolithic semiconductor integrated circuit substrate and the sensor comprises a p-n junction sensor overlaying the substrate, a p-n photodiode, an avalanche photodiode integrated in the substrate, or a radiation sensor for detecting charged particles and/or X-ray photons.

In one embodiment, the substrate comprises a silicon crystal bulk into which the sensor and amplifier are introduced.

The sensing device may comprise an amorphous Si:H PIN diode having a plurality of amorphous Si:H layers comprising an N doped layer, an Intrinsic layer, and a P doped layer, the layers being deposited above the substrate. In an alternative embodiment, the sensing device further comprises an amorphous selenium layer, the amorphous selenium layer being deposited above the substrate. The use of an amorphous selenium layer is particularly advantageous in X-ray applications, such as mammogram procedures. It has a higher conversion efficiency for X-ray photons of energy above 10 KeV than that provided when amorphous Si:H is used.

The amplifier may be implemented as a non-linear transresistance amplifier.

The sensor and the amplifier may be diffused onto the substrate or deposited onto the substrate.

According to the present invention in yet another aspect there is provided a device for producing a signal corresponding to a detection event comprising one or more of the sensing devices defined above, further comprising a readout circuit for receiving the output of one or more of the sensing devices and producing an output signal corresponding to the detection event.

The device may further comprise a detection plane array of the sensing devices defined above.

In an embodiment, the readout circuit is a complementary metal oxide semiconductor (CMOS) circuit formed on the substrate and the substrate may be of a first conductivity type, the CMOS circuit comprising one or more metal oxide field effect transistors of a first conductivity type, a well region of a second conductivity type in said substrate, and one or more metal oxide semiconductor transistors of a second conductivity type formed in the well region.

The readout circuit may comprises a first section and a second section. The first section may comprise a non-linear transresistance amplifier.

In an embodiment, the non-linear transresistance amplifier comprises a transconductance amplifier, a feedback field effect transistor, and an input current source.

The second section may comprise a transistor discriminator for generating a binary signal for each quantum of electromagnetic energy and/or charged particle detected.

The device may be is arranged to detect each quantum impinging upon each sensing device, providing Single Particle Detection (SPD).

The device may be arranged to integrate charges and sequentially reading the charges out for standard APS operation.

The sensor may be a p-n sensor or p-i-n sensor, and the amplifier have an input sensing node, the input sensing node being connected to the drain of the feedback field effect transistor, the electrode of the sensor and the drain of the input current source.

The readout circuit may have an output current, and the readout circuit be arranged to receive external reference signals, the external reference signals comprising a voltage reference, a current reference, and a bias current, wherein the external reference signals and the output current from the readout circuit are common to the one or more sensing devices.

The feedback field effect transistor may have its source connected to the output of the transconductance amplifier.

In an embodiment, the feedback field effect transistor is arranged such that the feedback field effect transistor has a drain current equal to a reference current mirrored by the input current source when the feedback field effect transistor is biased in weak inversion, the field effect transistor forming the input current source, and the feedback field effect transistor DC biasing the sensor.

The feedback field effect transistor may be arranged such that when biased at a low current between around 1–20 pA the current decreases when an input signal occurs at the input sensing node by a particle or photon impinging on the p-n or p-i-n sensor.

The transconductance amplifier may be in closed-loop when said feedback field effect transistor operates as a feedback network and has a drain current above zero.

In an embodiment, the transconductance amplifier is arranged to operate like a transresistance stage with the feedback field effect transistor operating as a feedback network.

The feedback field effect transistor may be arranged such that when the feedback field effect transistor turns off for an input signal charge above a threshold value the feedback field effect transistor has a drain current of about zero.

The quantum may provide an input charge to the sensor, wherein the input threshold charge is around 10 to 15 e– at a reference current of around 10 pA.

The non-linear transresistance amplifier may be arranged to be in open loop when the feedback field effect transistor turns off for an input signal above threshold.

The non-linear transresistance amplifier may have a low gain for small input signals below threshold when the feedback transistor is turned on, and the non-linear transresistance amplifier has a large gain for signals above threshold when the feedback transistor is turned off.

In an embodiment, the discriminator transistor has its gate connected to the output of the amplifier, and its drain connected to the output of the sensing device, the output port of the sensing device being connected to the output signal, the output signal being a current.

The readout circuit may be arranged to receive a voltage reference, the voltage reference establishing the voltage of the output node of the transconductance amplifier through gate-to-source voltage of the feedback transistor.

The voltage reference may be arranged to bias the transistor discriminator in weak inversion at a drain current of few nanoamps.

The quantum may impinge on one or more of the sensing devices generating a voltage across the sensor forming an input sensing node voltage, the input sensing node voltage decreasing and output voltage of the transconductance amplifier increasing when the quantum impinges on one or more of the sensing devices.

The device may be arranged such that when a voltage increases of the output node of the transconductance amplifier occurs, the drain current of the discriminator transistor increases as the exponential of the voltage variation of the output voltage of the transconductance amplifier.

The drain current increase of the discriminator transistor may be 1000 times (3 current decades) its value between around 1 nA to 1 µA for an output voltage increase of the transconductance amplifier of about 250 mV.

The current drain increase of the transistor discriminator may switch the voltage of the output port of the sensing device and generates a binary signal.

An output voltage increase of about 250 mV may be generated by an input charge of about 25 e−.

The readout circuit may be arranged to receive a voltage reference giving a voltage reference value, the voltage reference value determining the standby current of the discriminator transistor to provide a discrimination threshold of the readout circuit.

The readout circuit may comprise an integrating active pixel sensor (APS) imager.

The integrating imager may include a source follower stage in place of a discriminator transistor.

The integrating imager may have an input current source, the input current source being switched off during integrating time and readout time.

The input current source may be periodically biased at about 10 pA during the reset time.

The device may be arranged such that the feedback transistor switches off when the input signal rises above threshold to open the loop around the amplifier to cause a large increase in gain of the amplifier and thereby heighten the sensitivity of the one or more sensing devices.

The amplifier may comprise a non-linear amplifier having an output and an input, the amplifier being arranged to have a feedback capacitance minimised to around $10^{-17}$ F for obtaining a charge-to-voltage conversion gain of about 5 mV to 10 mV at its output for each electron entering its input.

The device may be an imaging device for producing an output signal corresponding to a detected image.

According to the present invention in yet another aspect, there is provided a macro-pixel comprising an array of sensing devices defined above, wherein the outputs of the sensing devices are combined to give the effect of a larger pixel. The outputs of the pixels may be connected to a bus. The macropixel may be configured such that if a sensing device in the macropixel should fail, the macropixel will continue to be operable but at a reduced sensitivity.

According to the present invention in a still further aspect there is provided an array of macropixels defined above connected to detect or form an image.

According to a yet further aspect of the invention there is provided a device comprising an array of the macropixels defined above wherein the imaging device is diffused into or deposited onto the surface of a wafer.

The invention, in one or more embodiments, is applicable to semiconductor imaging and radiation detection devices, in particular to monolithic silicon active pixel sensor arrays capable of detecting single photons or particles, such as visible light, X-rays, and charged particles such as electrons or protons. The monolithic approach allows fabrication in a standard CMOS process.

In an embodiment, the invention is embodied in an imaging device formed as a monolithic, complementary metal oxide semiconductor integrated circuit in an industrial standard metal oxide process. The pixel integrated circuit may include an amorphous Si:H PIN diode for collecting single photon/particle-generated charge deposited above the integrated circuit overlying the substrate, or an n-well junction or other diode in an underlying region of the epitaxial layer and bulk substrate. The pixel integrated circuit also may include, a readout circuit having at least a transconductance amplifier, and an N-MOSFET feedback device in the p-doped substrate. The N-MOSFET feedback device may be connected between the sensing node formed by the connection of the input of the transconductance amplifier with the pixel sensor electrode and the output node of the transconductance amplifier.

In an embodiment, the transconductance amplifier is a four-device circuit formed by two P-MOSFET transistors and two N-MOSFET transistors. In this embodiment, the two P-MOSFET transistors operate as a high gain input cascode amplifier circuit with the input gate connected to the sensor element which could be an N-well electrode, or the PIN amorphous Si:H diode. The two N-MOSFET transistors operate as a high impedance cascode output current source. This embodiment includes an N-MOSFET feedback device that is biased in deep weak inversion by an additional input current source P-MOSFET, which forms, together with a diode connected P-MOSFET, a current mirror that is biased by an external current source.

The feedback MOSFET transistor may be biased to a sufficiently low current, for example between 1 pA to 20 pA, to enable it to be switched off when a small input signal charge of 1 e− to 20 e− arrives at the input. The four MOSFET transistor cascode amplifier may operate in open loop once the feedback MOSFET transistor is switched off by the input signal. The output N-MOSFET discriminator transistor may sense the voltage of the output node with its gate connected to the output node, its drain connected to an external current source, and its source connected to the ground. An external voltage $V_{REF}$ may control the voltage of the output node of the cascode transconductance amplifier and determines the operating conditions of the output N-MOSFET discriminator transistor. The voltage $V_{REF}$ may be chosen in such a way that the output MOSFET transistor is biased in the sub-threshold region (which is also termed weak inversion) and switches on when an input charge signal occurs thereby moving the output node of the discriminator transistor from the supply voltage VDD to ground. The dimensions of the input P-MOSFET transistors may be sized for minimum noise compared with the N-well diffusion capacitance, or the PIN amorphous Si:H diode capacitance.

The N-MOSFET transistors of the output current source may be dimensioned and laid out for minimum drain capacitance. The parasitic capacitance between the input node and the output node of the amplifier may be minimised in order to maximise the open loop gain of the amplifier branch. The amplifier may be biased with a low current to keep the power consumption of the pixel cell below 250 nW. The readout circuit may further include a fast OR-line connecting together a group of pixels. The group of pixels forms a macropixel that is read out by the peripheral readout of the integrated circuit. Each macropixel may have a driver circuit that interfaces with the readout of the end-of-column logic circuit.

In an embodiment, there is provided an analogue output for summing signals inside a macropixel. In another embodiment, the invention is arranged to have high gain signal integration for very sensitive APS applications in which the reference current is controlled to perform a soft pixel reset without kTC reset noise.

BRIEF DESCRIPTION OF THE DRAWINGS

Embodiments of the invention will now be described, by way of example only, with reference to the accompanying drawings in which.

DETAILED DESCRIPTION OF THE EMBODIMENTS

In the various figures, like reference signs refer to like parts.

Figure 2A:
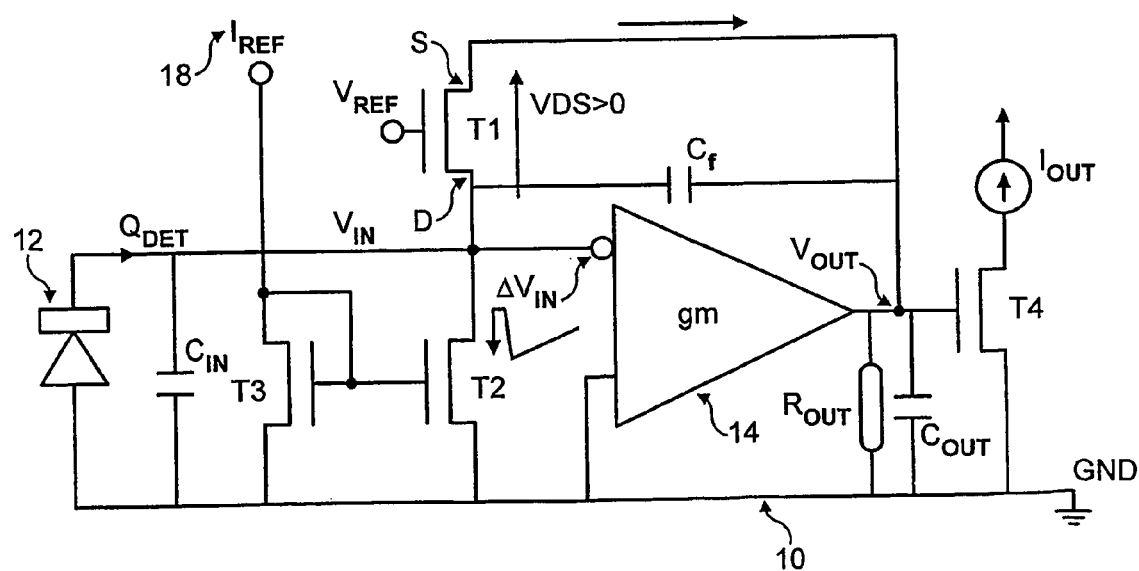
FIG. 2A is a schematic circuit diagram of a sensing device, embodying the invention.

FIG. 2A shows a simplified schematic block diagram of one sensing device 10, such as a pixel cell, of a Single Particle Detector (SPD) planar array of many such devices, or cells, formed in an integrated circuit. The sensing device 10 has a sensor 12, an inverting transconductance amplifier 14, a current mirror formed from two transistors T2 and T3, a feedback MOSFET transistor T1, and an output MOSFET discriminator transistor T4. The sensor 12 is connected to the input of the amplifier 14. The feedback MOSFET transistor T1 has its main current path connected between the input and the output of the amplifier 14 and the output of the amplifier 14 is fed to the output MOSFET discriminator transistor T4, and is configured to be able to provide negative feedback. The discriminator transistor T4 is driven directly from the output node of the transconductance amplifier 14. The transistor T4 acts as a switch, remaining off until its gate voltage reaches the threshold voltage of the transistor, so that the output $I_{OUT}$ remains at zero until that threshold is exceeded, thus providing a binary output. The total capacitance $C_f$ between the input node and the output node of the amplifier 14 is the sum of the parasitic capacitance between the input node and the output node added to the drain-to-source capacitance of the feedback transistor T1.

Figure 18:
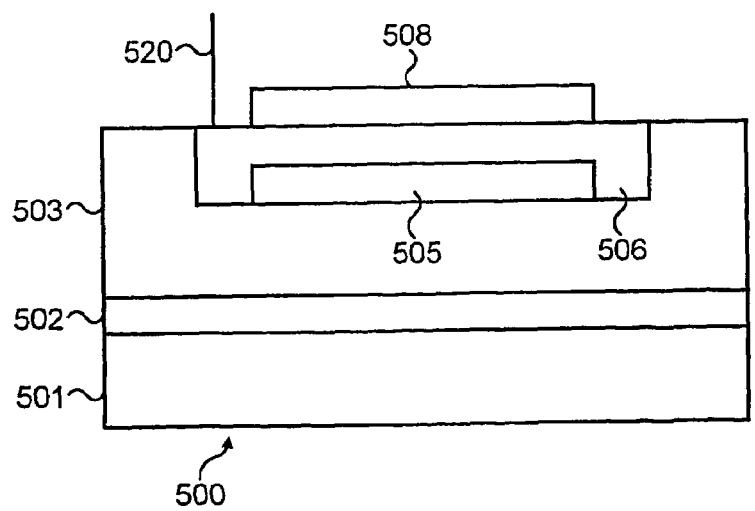
FIG. 18 shows an avalanche photodiode structure integrated on a silicon substrate using a CMOS process for use in the invention.

A number of different sensors and sensor types may be used. Among these are a pixel sensor comprising an N-well diffusion worling in linear or avalanche regime, a PIN amorphous silicon sensor deposited onto the substrate, a p-n photodiode, an avalanche photodiode integrated in the substrate, a radiation sensor for detecting charged particles and/or X-ray photons or a PIN amorphous Si:H diode (in the case of the amorphous-silicon-thin-film-above-integrated-circuit implementation). The sensor may include any high atomic number X-ray detecting material deposited on or over the substrate, specific examples being mercuric iodide, lead iodide, and amorphous selenium, for example forming a pin diode. Another alternative sensor is an avalanche photodiode integrated on the silicon substrate, as shown in FIG. 18.

An input current source $I_{REF}$ 18 is mirrored by the current mirror comprising the diode-connected MOSFET transistor T3 and transistor T2.

In the embodiment illustrated in FIG. 2A, the current source 18 ($I_{REF}$) injects current via the current mirror T2, T3, into the feedback MOSFET transistor T1. The typical range value of $I_{REF}$ is between 1 pA to 20 pA biasing the feedback MOSFET transistor T1 deeply in weak inversion. The source of the feedback MOSFET transistor T1 causes the potential of the output $V_{OUT}$ of the transconductance amplifier 14 to be governed by the gate voltage $V_{REF}$. The precise potential value of the output node is:

$$V_{OUT} = \frac{V_{REF}}{n} - U_T \text{Log} \frac{I_{REF}}{[2n\mu C'_{ox} W/L\ U_T^2]}$$

The value of the reference voltage $V_{REF}$ is chosen such that the potential $V_{OUT}$ of the output node is held lower than the potential of the input node $V_{IN}$. This biases the feedback MOSFET transistor T1 to have a positive drain-to-source voltage sufficient to operate it in saturation.

The DC input voltage $V_{IN}$ is determined by the operating condition of the input circuit of the transconductance amplifier 14. Typically this will be a MOSFET amplifier, and the DC level is then typically the supply voltage VDD minus the gate-to-source voltage of a MOSFET transistor serving as input transistor of the amplifier 14.

Each electromagnetic radiation quantum impinging on the substrate and epitaxial layer in the vicinity of the p-n junction formed in the sensor 12 generates a packet of electron-hole pairs (typically 80 e⁻h pairs for 1 μm thick silicon layer). The electron charge packet $\Delta Q_{DET}$ then drifts (by thermal diffusion, or by the electric field in the case of the amorphous-silicon-thin-film-above-integrated circuit implementation) and is collected in the sensor 12, thereby building up a negative voltage step $-\Delta V_{IN}$ at the input of the transconductance amplifier 14 superimposed on its DC potential $V_{IN}$.

The size of the voltage step $\Delta V_{IN}$ is $$\frac{\Delta Q_{DET}}{C_{IN}},$$

where $C_{IN}$ is the total input capacitance including all capacitances connected to the input sensing node, which is typically 2 fF–5 fF (around 2 for a PIN amorphous Si:H diode to 3–5 fF for a diode sensor in the bulk material). The input voltage step $\Delta V_{IN}$ generates an output current step $\Delta I_{OUT}$ at the output of the transconductance amplifier 14.

The size of the current step is given by $\Delta I_{OUT} = -gm\Delta V_{IN}$.

The amplifier 14, by virtue of the feedback transistor T1, works initially as a transresistance amplifier and consequently the reference input current $I_{REF}$ is mirrored in the feedback branch formed by the feedback MOSFET transistor T1. In the steady state, the feedback transistor T1 is operated in grounded gate configuration with the source as the output node and the drain as the input node.

When a hit by a particle or photon occurs, the negative voltage step $-\Delta V_{IN}$ is built up at the input of the transconductance amplifier 14 which then generates an output current step at its output $\Delta I_{OUT} = -gm\ \Delta V_{IN}$. This current change produces a rising voltage $\Delta V_{OUT}$, which decreases the feedback current from its initial value $I_{REF}$, to a lower value depending on the $\Delta V_{IN}$ amplitude. If this $\Delta V_{IN}$ change is sufficiently large, the drain current of the feedback MOSFET transistor T1 decreases to zero and the transconductance amplifier 14 starts to function in open-loop mode. If this variation $\Delta V_{IN}$ is instead small enough to maintain the feedback drain current greater than zero, then the transconductance amplifier loop remains closed, and continues to function as a transresistance amplifier.

The current $I_{REF}$ is selected to keep the feedback transistor T1 in deep weak inversion giving an extremely low drain-to-source capacitance $C_{DS}$ of around 5–20 aF to maintain high sensitivity to an incoming a quantum or incoming quanta.

Where a deep submicron CMOS FET is used as the feedback transistor T1, such devices being of the order of 0.25 μm, or smaller, and which are biased in deep weak inversion, the capacitance from drain-to-source tends to zero when the gate-to-source voltage is less than 0.4V. Under these conditions, such a feedback transistor T1 operates as a switch controlled by the input signal itself, needing no additional reset facility and hence the device has no reset noise.

Figure 2B:
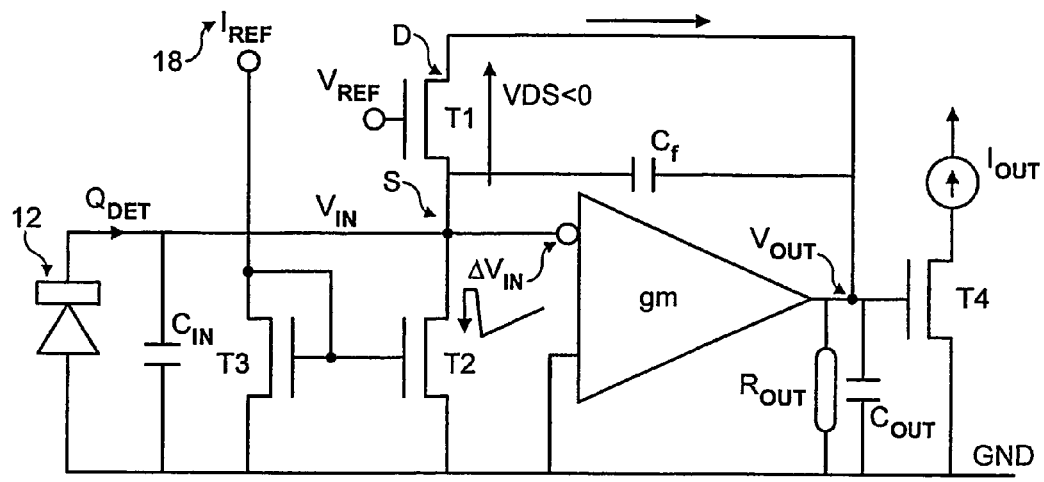
FIG. 2B is a schematic circuit diagram corresponding to FIG. 2A, illustrating an open-loop condition with polarity inversion across a feedback transistor of an amplifier thereof.

FIG. 2B shows the sensing device, of FIG. 2A in open-loop condition with the source S and the drain D of T1 interchanged compared to that shown in FIG. 2A.

In the conditions shown in FIG. 2B, the threshold for the transition from closed-loop to open-loop occurs at a very small drain current of the feedback MOSFET transistor T1. When the output voltage variation of the output node of the transconductance amplifier 14 is large enough to invert the polarity of the drain-to-source voltage of the feedback MOSFET transistor T1, the drain swaps with source, as shown in FIG. 2B. The source becomes the node connected to the input sensing node. The gate-to-source voltage of the feedback MOSFET transistor T1, defined by the reference voltage $V_{REF}$ minus the input DC voltage of the transconductance amplifier 14—is constant during the polarity inversion time period.

The OFF drain current of T1 is defined by $$I_{Doff} = 2n\mu C''_{ox} W/L\ U_T^2 e^{\frac{V_{REF} - n\Delta V_{INDC}}{nU_T}}$$

The voltage reference $V_{REF}$ is low enough that the gate-to-source voltage of the feedback MOSFET transistor T1 keeps this OFF-drain current small enough to avoid discharging the input sensing node and the output node of the transconductance amplifier 14.

Typically, the open-loop transition of the transconductance amplifier 14 and the drain-source polarity inversion of the feedback MOSFET transistor T1 occurs for sensed input charge greater than 10 e–. In this operational mode the amplifier stage has a voltage gain defined by:

$$\frac{\Delta V_{OUT}}{\Delta V_{IN}} = -gm.R_{OUT}$$

For typical values of transconductance gm of $10^{-5}$S, and output resistance $R_{OUT}$ of the transconductance amplifier 14, of $10^8$ to $10^9$ ohms, typical open voltage gain $$\frac{\Delta V_{OUT}}{\Delta V_{IN}}$$

is about 1000 to 10000. Therefore, a conversion gain of 5 to 10 mV/e– may be achieved which is a value that is 3 orders of magnitude larger than those of known APS pixel cells.

For this very high gain, the rise time of the output voltage at the transconductance output node is determined by the slew rate imposed by the output current of the transconductance amplifier 14, and not by the output time constant $R_{OUT}C_{OUT}$. The output voltage rise time is governed by the equation:

$$\frac{\Delta V_{OUT}}{\Delta V_t} = \frac{qQ_{DET}}{nkTC_{OUT}C_{IN}} I_{BIAS}$$

where $I_{BIAS}$ is the bias current.

Response time $\Delta t_R$ is determined by the minimum detectable voltage $\Delta V_{MIN}$ seen at the input of the transistor discriminator T4 and is defined by:

$$\Delta t_R = \Delta V_{MIN} \frac{nkTC_{OUT}C_{IN}}{qQ_{DET}I_{BIAS}}$$

After an input charge event, the feedback loop remains open until the input current source 18 charges the input sensing node to its initial DC value with a time equal to about $Q_{DET}/I_{REF}$. This is a smooth charge, not a step event. For typical values of $I_{REF}$ and $\Delta Q_{DET}$ of 10 pA and 100 e-, the recovery time is about 1.6 microsecond. The time constant of the output node, which is shorter, is defined by $\tau_{OUT} = R_{OUT}C_{OUT}$.

For Rout=$10^8$ and Cout=1 fF, the time constant is typically 100 ns.

The value of the current reference $I_{REF}$, adjusted externally on the periphery of the chip, determines the threshold level that triggers the open loop regime.

The feedback MOSFET transistor T1, together with the input current source 18 ($I_{REF}$), provides automatic DC control of the potential of the input sensing node, without the need for any additional reset device. The feedback MOSFET transistor T1, together with its associated diode-strapped MOSFET transistor T3 of the current mirror T3 T2 which mirrors the current $I_{REF}$, also provides the control of the non-linear operation of the amplifier 14 and determines the threshold of the open-loop operation.

The value of the voltage reference $V_{REF}$, adjusted externally on the periphery of the chip, determines the threshold level of the output MOSFET transistor T4 which acts as a discriminator transistor. During the occurrence of an input charge $\Delta Q_{DET}$, the gate of the output MOSFET transistor T4 senses the positive signal voltage pulse $\Delta V_{OUT}$ generated at the output of the transconductance amplifier 14, and generates an output current that quickly lowers the output node from the positive supply rail to the ground level. The output MOSFET transistor T4 works in weak inversion, and with an appropriate value of $V_{REF}$, output transistor T4 works likes a discriminator. The exponential current $I_{DO}$ rise providing the discrimination effect is governed by:

$$I_{DO} = 2n\mu C''_{OX} W/L U_T^2 e^{\frac{V_{REF} - n\Delta V_{OUT}}{nU_T}}$$

For example, a DC drain current of transistor 30 set to 1 nA by $V_{REF}$, and a output voltage swing $\Delta V_{OUT}$ 10 times $U_T$ (250 mV) raises the drain current 3 orders of magnitude to 1 μA, which is sufficient to switch the output node fed down to ground level with an external current source set to 0.5 μA.

The output MOSFET transistor T4 provides a fast signal discrimination function with a threshold value between 5 $U_T$ to 10 $U_T$. Transistor T4t also provides a local line driver function in generating an output binary signal without consuming power, except when the circuit is activated by the occurrence of an input charge $\Delta Q_{DET}$ above its threshold.

Figure 3:
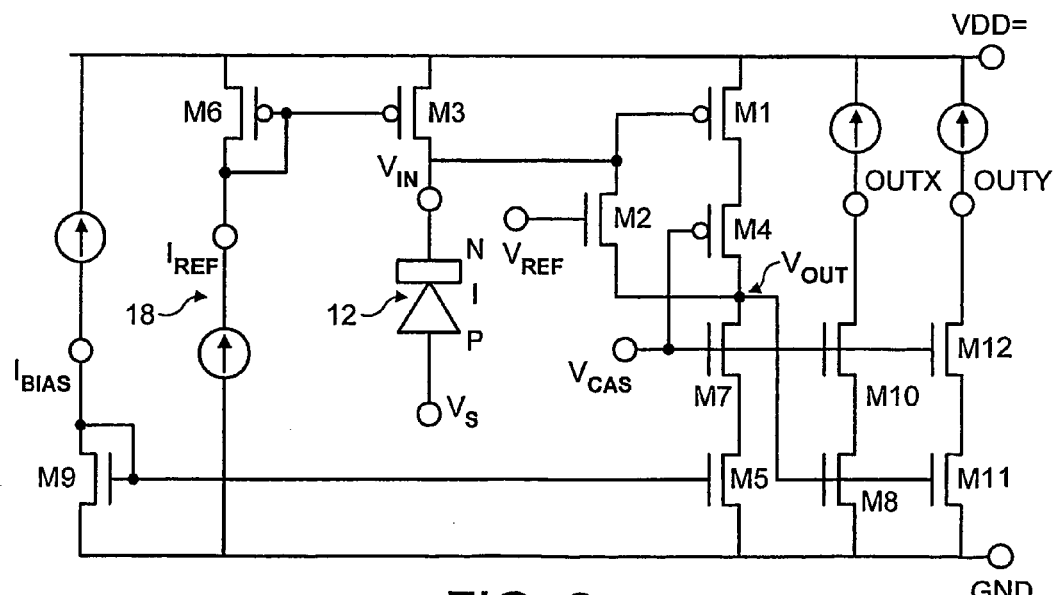
FIG. 3 is a schematic circuit diagram illustrating a binary circuit of an individual sensing device embodying the invention.

FIG. 3 shows a binary implementation of a sensing device, embodying the invention. The sensing device comprises a sensor 12, a transconductance amplifier having two transistors M1 and M4, a current source 18, a current mirror having two transistors M3 and M6, a feedback transistor M2, and an output stage comprising four transistors M8, M10, M11, M12, two cascode transistors M10, M8 providing output X and two cascode transistors M11, M12 providing output Y. The sensor 12 is connected to the input of the transconductance amplifier M1 M4. The current source 18 is connected to the node of the input of the transconductance amplifier M1 M4 and the sensor 12. The feedback transistor M2 is connected between the input and output of the transconductance amplifier M1 M4. The output of the transconductance amplifier M1 M4 is connected to the output stage M10 M8 and M11 M12. Constant current load to the output of the transconductance amplifier M1 M4 is provided by a cascode current mirror with driving diode-strapped transistor M9, and driven transistor M5 in cascode with transistor M5. The common gate transistors M7, M10 and M12 have a single gate voltage VCAS. The X output current is taken from the drain of common gate transistor M10 and the Y output current is taken from the drain of common gate transistor M12.

As illustrated in FIG. 3, the output discriminator stage M10 M8 and M12 M11 of the sensing device consists of a cascode amplifier formed by the N-MOSFET transistors M8 M10 and M11 M12. The complete dynamic operation of the circuit of FIG. 3 is like that described with regard to FIGS. 2A and 2B above, however, the sensor 12 is connected between a bias voltage $V_s$ and the input node $V_{IN}$. In embodiments where the sensor 12 is an amorphous Si:H PIN diode deposited on ASICS, $V_s$ is selected to be in the region −10V to −300V. In embodiments where the sensor 12 is a p-n diode junction diffused on a substrate, $V_s$ may be at ground.

The circuit of FIG. 3 may also be modified for circuit compactness reasons by replacing cascode current source M5 M9 with a simple current source and the cascode discriminator transistors M8 M10 with a single discriminator transistor.

Figure 10:
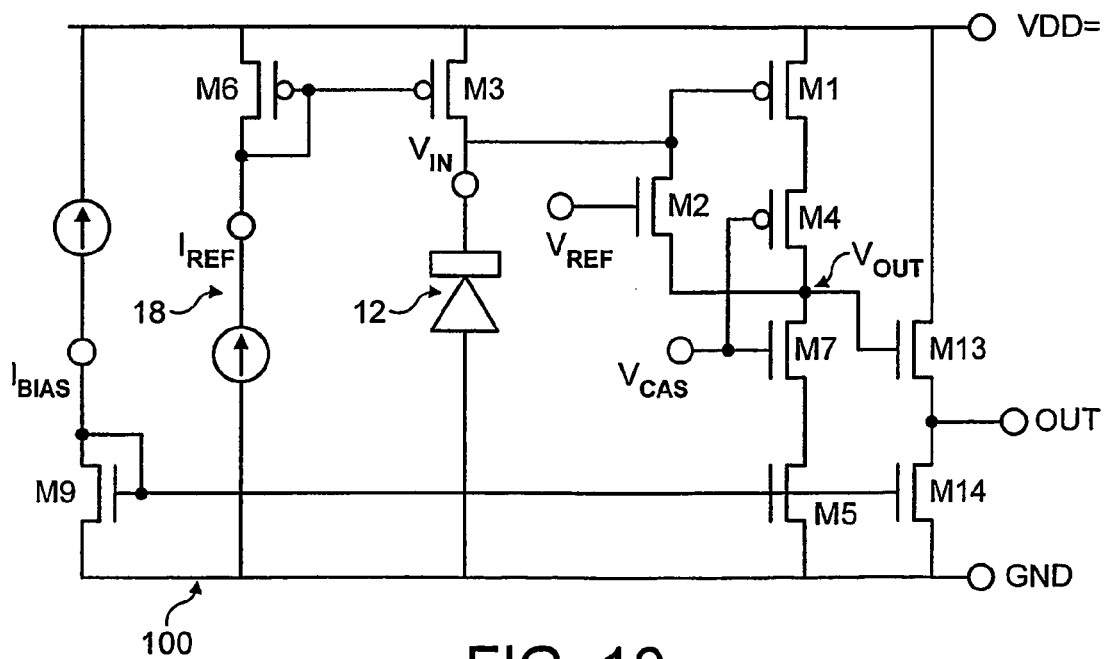
FIG. 10 is a schematic diagram of the architecture circuit for a charge integrating device embodying the invention.

In another embodiment, an analogue readout may be obtained by replacing the discriminator transistor with an output analogue buffer as illustrated in FIG. 10.

The amplifier branch M1 M4 M5 M9 is biased with a drain current $I_{BIAS}$ of about 200 nA keeping power consumption at about 250 nW for a power supply VDD set to 1.4V.

The feedback transistor consists of an N-MOSFET transistor M2 dimensioned close to minimum size and working in weak inversion in the saturation region. The transistor M2 is connected with its drain to the input node, and its source to the output node. The input current source formed by a P-MOSFET transistor M3 is biased at a drain current chosen between 1 pA to 20 pA by the current mirror M6. M3 injects the same current in the feedback transistor M2 that provides DC feedback of the amplifier branch M1 M4 M5 M9. M3 keeps the potential of the input-sensing node $V_{IN}$, which is the gate of the transistor M1, automatically at the value needed to bias M1 to the drain current imposed by the cascode current source M5 M9 and provides the bias potential of the sensor.

Figure 4:
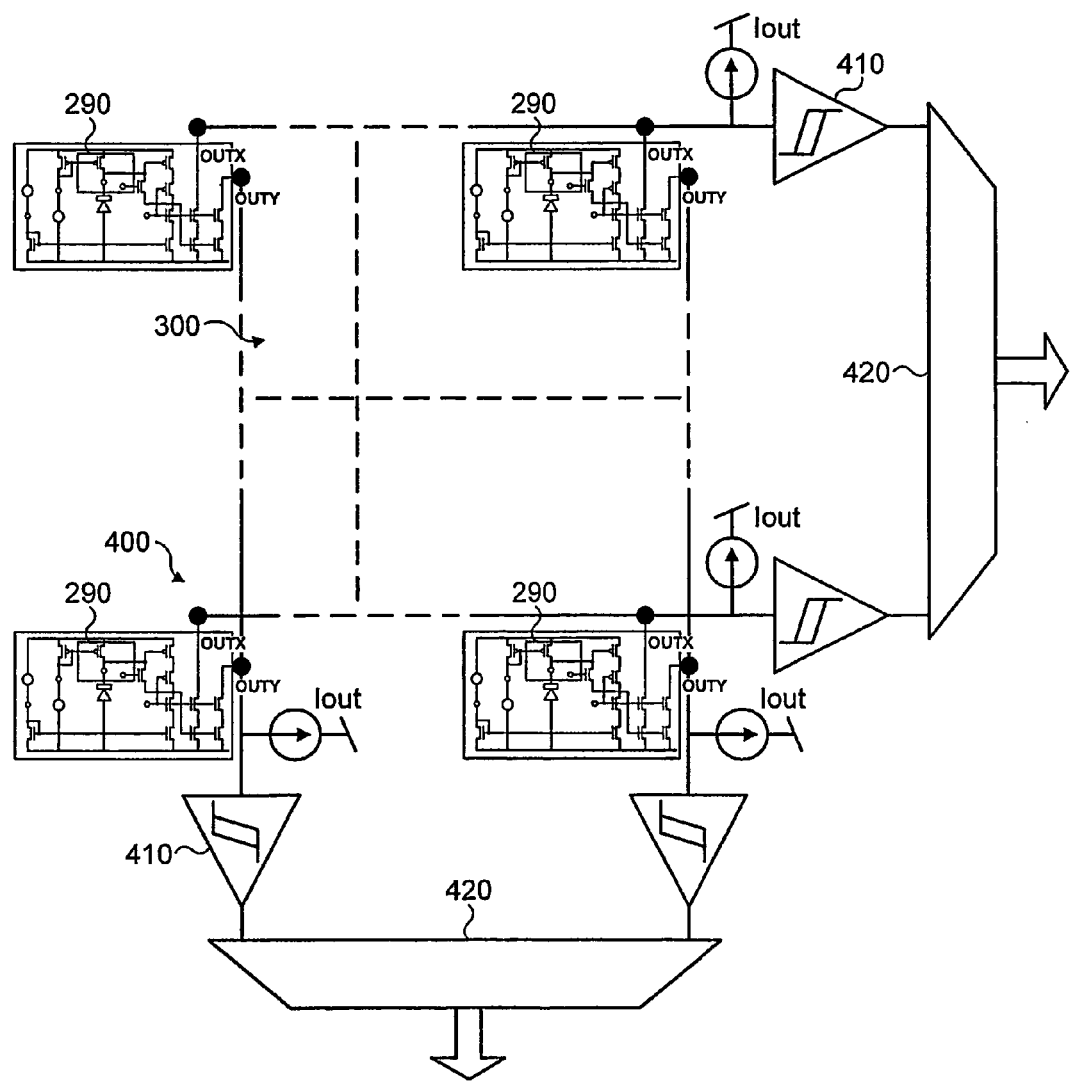
FIG. 4 is a schematic circuit diagram of a circuit for reading the outputs of a plurality of sensing devices.

FIG. 4 shows a sensing array 400 comprising an array 300 of sensing devices, for example pixels, of the type shown in FIG. 3 or a macropixel 290 (an array of pixels connected to act as a single sensor) connected in a matrix of m rows and n columns. The X output of each row is connected to the input of a sense amplifier-comparator 410, there being one sense amplifier-comparator associated with each row. Similarly, the Y outputs of the sensing devices, which may be pixels, in each column are connected to the input of a sense amplifier-comparator 410. The sense-amplifier-comparators connected to the X outputs and the sense-amplifier-comparators connected to the Y outputs asynchronously detect the presence of a hit on a sensing device, for example a pixel, by electromagnetic radiation or charged particles. The outputs of the sense amplifier-comparators 410 are encoded into a binary word in a thermometric-to-binary encoder 420 to give the X and Y addresses/co-ordinates of the sensing device (e.g. pixel) which has received the hit. The X and Y addresses/co-ordinates are then available off-chip in the form of two digital bytes.

Figure 5:
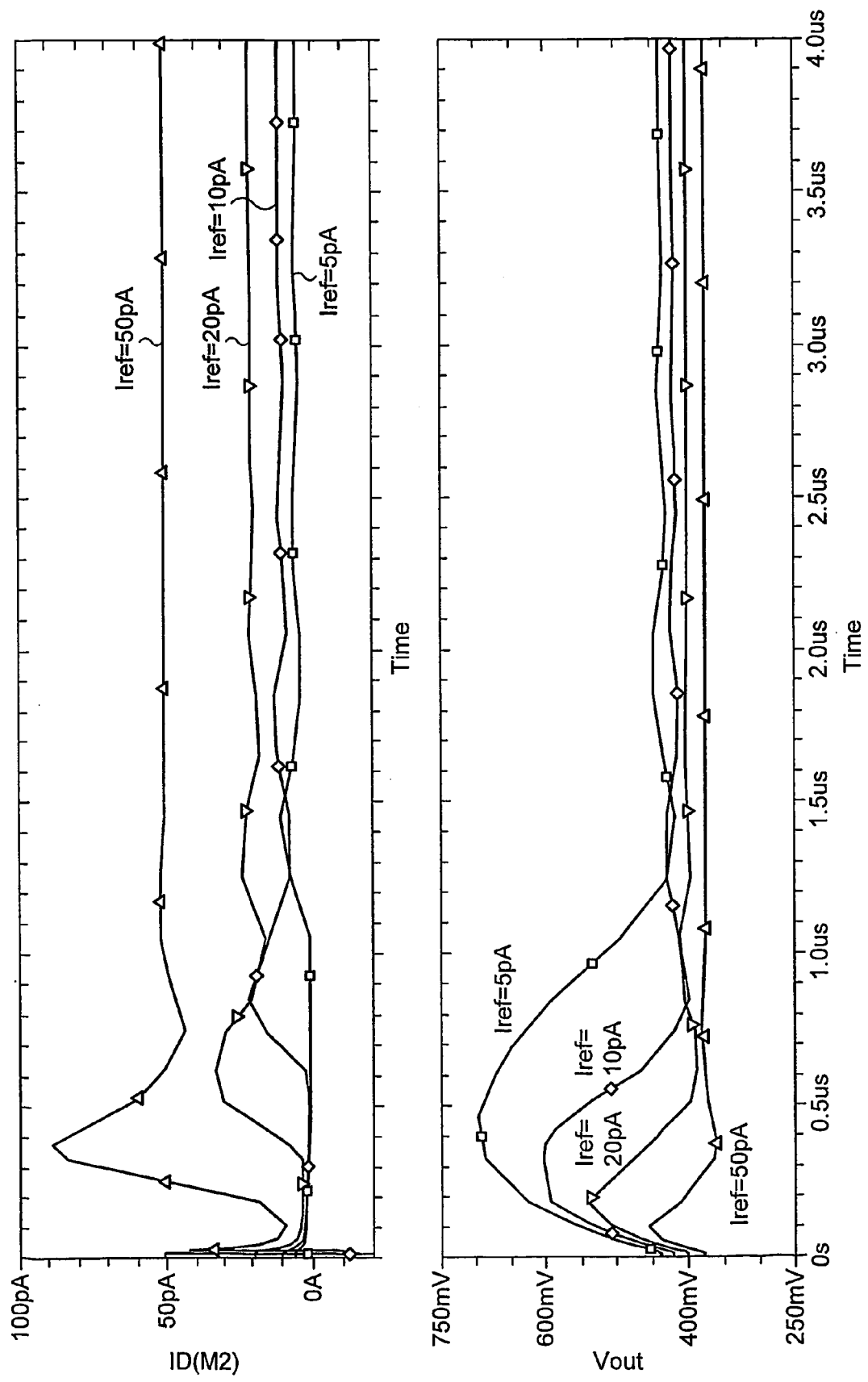
FIG. 5 is a graph of waveforms showing the transition from closed-loop to open-loop operation of an amplifier of FIGS. 2A, 2B and 3.

FIG. 5 shows a simulation of the waveforms of the input and output nodes of the transconductance amplifier of FIGS. 3 (and 10) at an input charge of 25 e⁻. The input node waveform shows the drain current of transistor M2, and the output node waveform shows the output voltage $V_{out}$. The waveforms show the transition from closed-loop to the open-loop operation as function of reference currents of 5 pA, 10 pA, 20 pA, and 50 pA, as simulated with SPICE™ for a 0.25 µm CMOS technology. The current $I_{BIAS}$ and the voltage $V_{REF}$ is constant and the same for all simulations.

Figure 6:
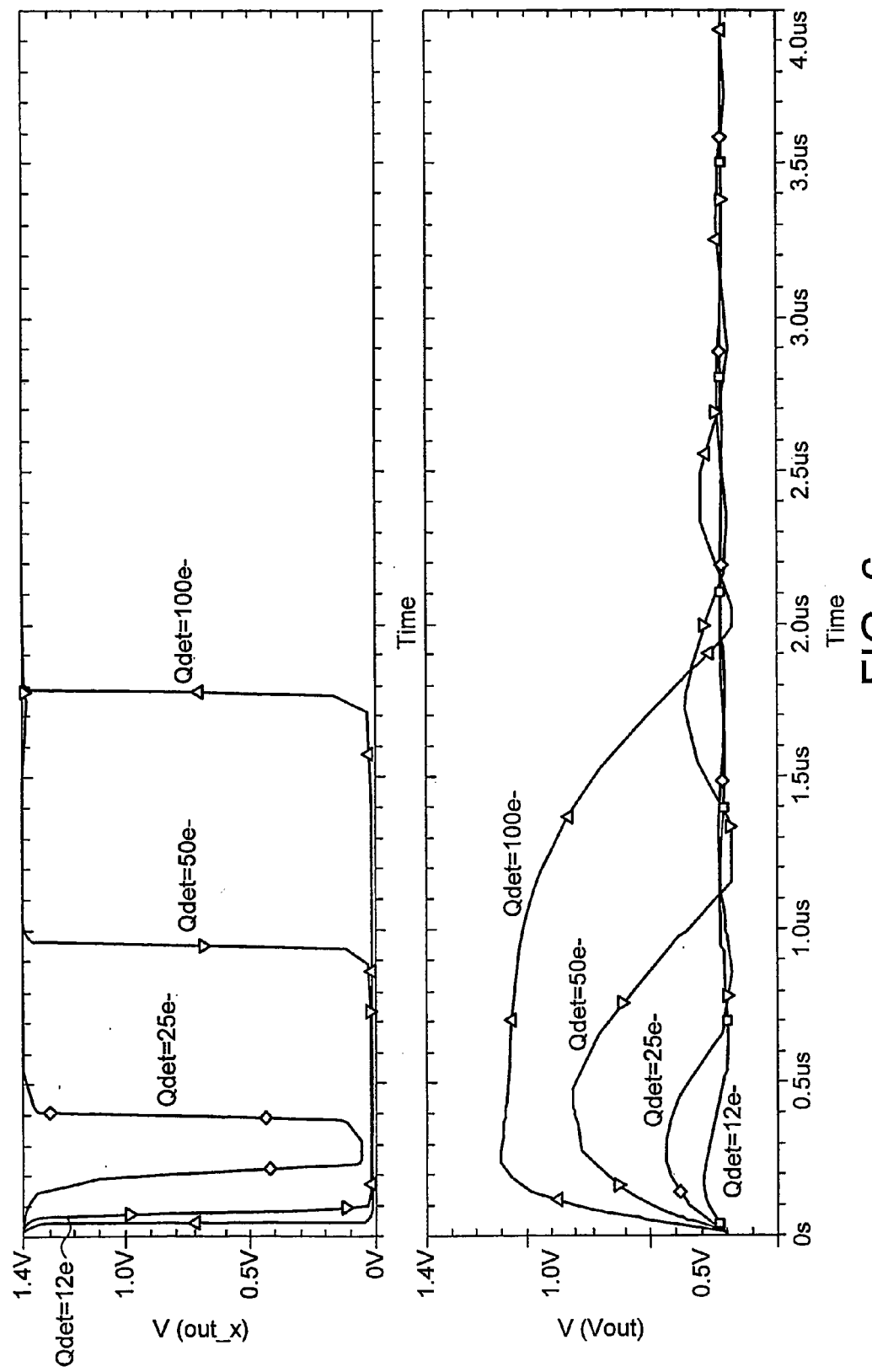
FIG. 6 is a graph of waveforms of the input sensing node, output transconductance amplifier node and output of a transistor discriminator of the pixel shown in FIGS. 2A, 2B and 3 for input charges of 12.5 e−, 25 e−, 50 e− and 100 e−.

FIG. 6 is a graph of the waveforms of the output of the discriminator transistors and the output transconductance amplifier node for input charges of 12 e–, 25 e–, 50 e– and 100 e–, as applied at $V_{out}$ of FIGS. 3 (and 10), as simulated with SPICE™ for a 0.25 µm CMOS technology.

Figure 7:
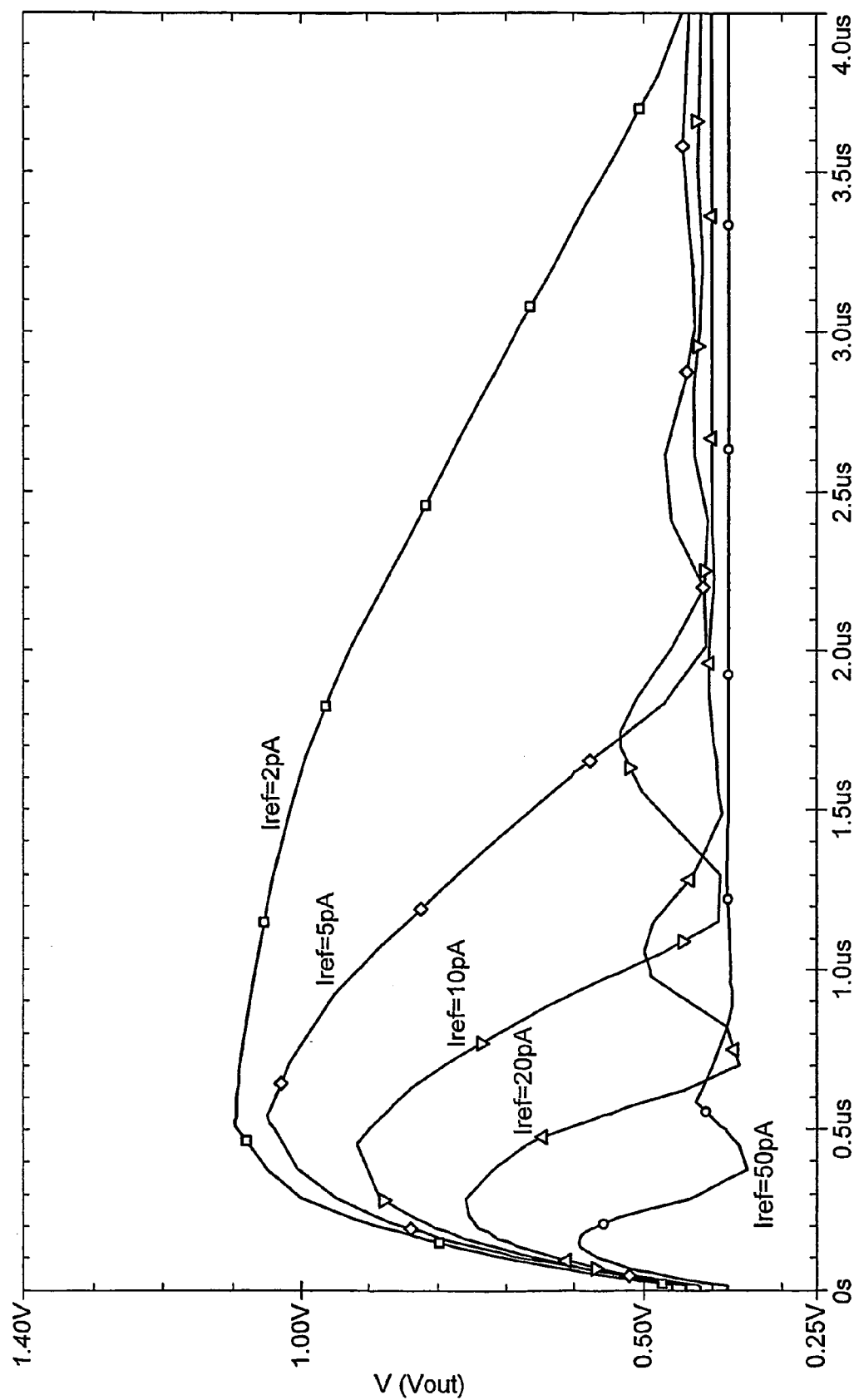
FIG. 7 is a graph of the waveforms of the output transconductance amplifier node of the sensor, for example a pixel, shown in FIGS. 2A to 3 for an input charge of 75 e− and input current of 1 pA, 2 pA, 5 pA, 10 pA and 20 pA.

FIG. 7 is a graph of the voltage waveforms of the output transconductance amplifier node for an input charge of 50 e– and input current of 2 pA, 5 pA, 10 pA, 20 pA, and 50 pA, as applied at $V_{out}$ of FIGS. 3 (and 10), as simulated with SPICE™ for a 0.25 µm CMOS technology.

Figure 8:
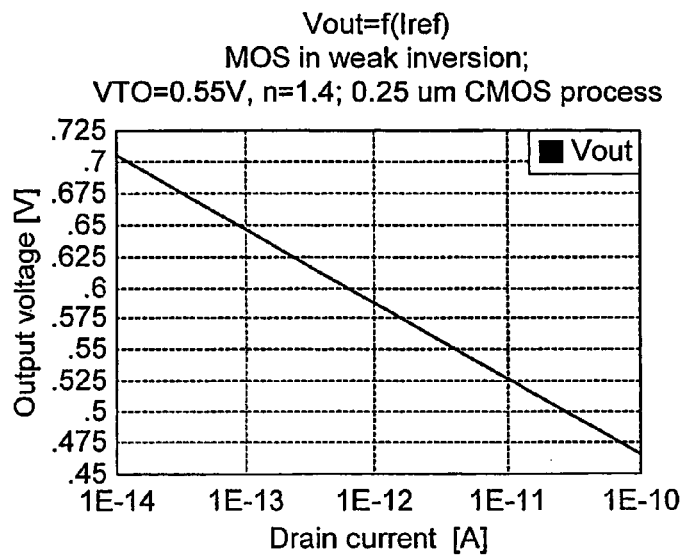
FIG. 8 is a graph of the variation of the source voltage with the drain current at a constant gate voltage of a feedback MOS transistor working in weak inversion as used in FIGS. 2A to 3.

FIG. 8 is a graph of the variation of the source voltage with the drain current at a constant gate voltage of an MOS feedback transistor working in weak inversion in the pixels shown in FIGS. 2A, 3 and 10.

Figure 9A:
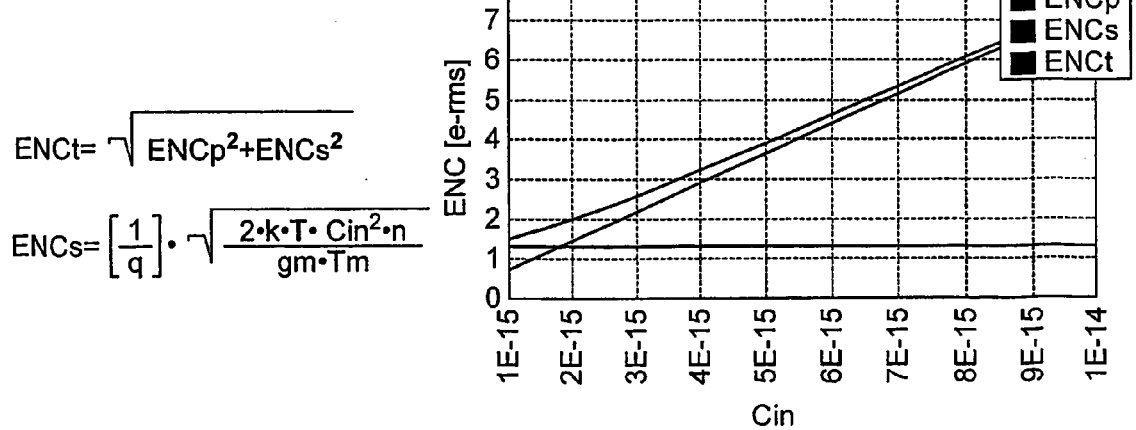
FIG. 9a is a graph of the noise calculation as function of the input-sensing node capacitance of the Single Particle Detection sensing device, such as a pixel cell, shown in FIGS. 2A to 3.

FIG. 9*a* is a graph of the calculated noise of the SPD pixel cell shown in FIGS. 2A to 3, and 10 as function of the capacitance at the input-sensing node.

Figure 9B:
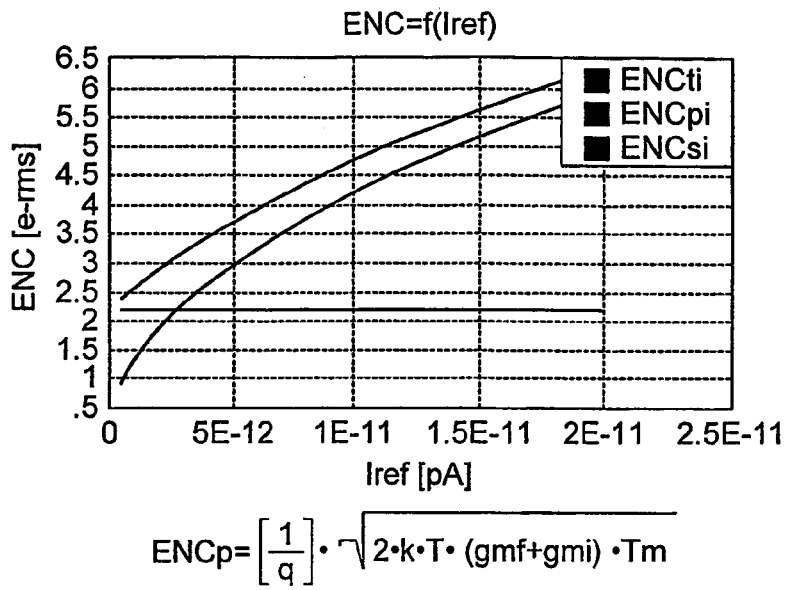
FIG. 9b is a graph of the noise calculation as function of reference current of the SPD sensing device shown in FIGS. 2A to 3.

FIG. 9*b* is a graph of the calculated noise of the SPD pixel cell shown in FIGS. 2A to 4 as function of reference current $I_{ref}$.

In another embodiment, as shown in FIG. 10, the integrating architecture circuit of an individual sensing device is illustrated for operation in standard APS imaging mode. This embodiment is applicable to conventional APS imagers where charges are sequentially integrated in sensing devices (e.g. pixel cells) and sequentially read out by column with an analogue multiplexer performing the readout operation.

The sensing device 100 of FIG. 10 comprises a sensor 12, a transconductance amplifier comprising two p-type transistors M1 M4 in cascode. The transistors together with feedback MOSFET transistor M2, and an input current source 18, operate as a high gain voltage amplifier between the input sensing node and a transistor M13 which acts as a source follower. The sensing device 100 also has a current mirror of two transistors M3 and M6, and an output stage comprising two transistors M13 and M14. The sensor 12 is connected to the input of the amplifier M1 M4. The current source 18 is mirrored by the current mirror M6 M3 to provide the input current of the amplifier 14. The feedback transistor M2 is connected between the input and output of the amplifier M1 M4. The output of the amplifier M1 M4 is connected to the output stage M13 M14. Constant current load to the output of the amplifier M1 M4 is provided by transistors M5, M7 and M9. The current is also fed to the output stage at transistor M14. The output of the sensing device 100 is taken as a voltage from the source of the other transistor M13 in the output stage. This is in contrast to the embodiment shown in FIG. 3 in which the output current is taken from the drain of the transistor discriminator M8 in the output stage.

Feedback MOSFET transistor M2 is kept at a very low current, for example 1 fA, that is, it is almost switched off, during the readout sequence and the integration of sensor charges into the input sensing node. The input-sensing node is floating during the integrating and readout time period, as the input current source is turned off at this time.

Once the sensor starts to supply sensor current, the negative feedback MOSFET M2 turns off, allowing the amplifier stage M1, M4 to go to an open-loop high gain state. During the integrating time period feedback MOSFET transistor M2 is OFF with an inverted polarity topology. A soft reset operation is then performed by applying an input DC current to the input current source 18, of the order of 10 pA, which biases feedback MOSFET transistor M2 in non-inverted polarity, and closes the loop on the non-linear transresistance amplifier M1M4. The floating diffusion of the sensor is then reset for the closed-loop DC potential of transconductance amplifier M1M4 without introducing kTC reset noise.

Figure 11:
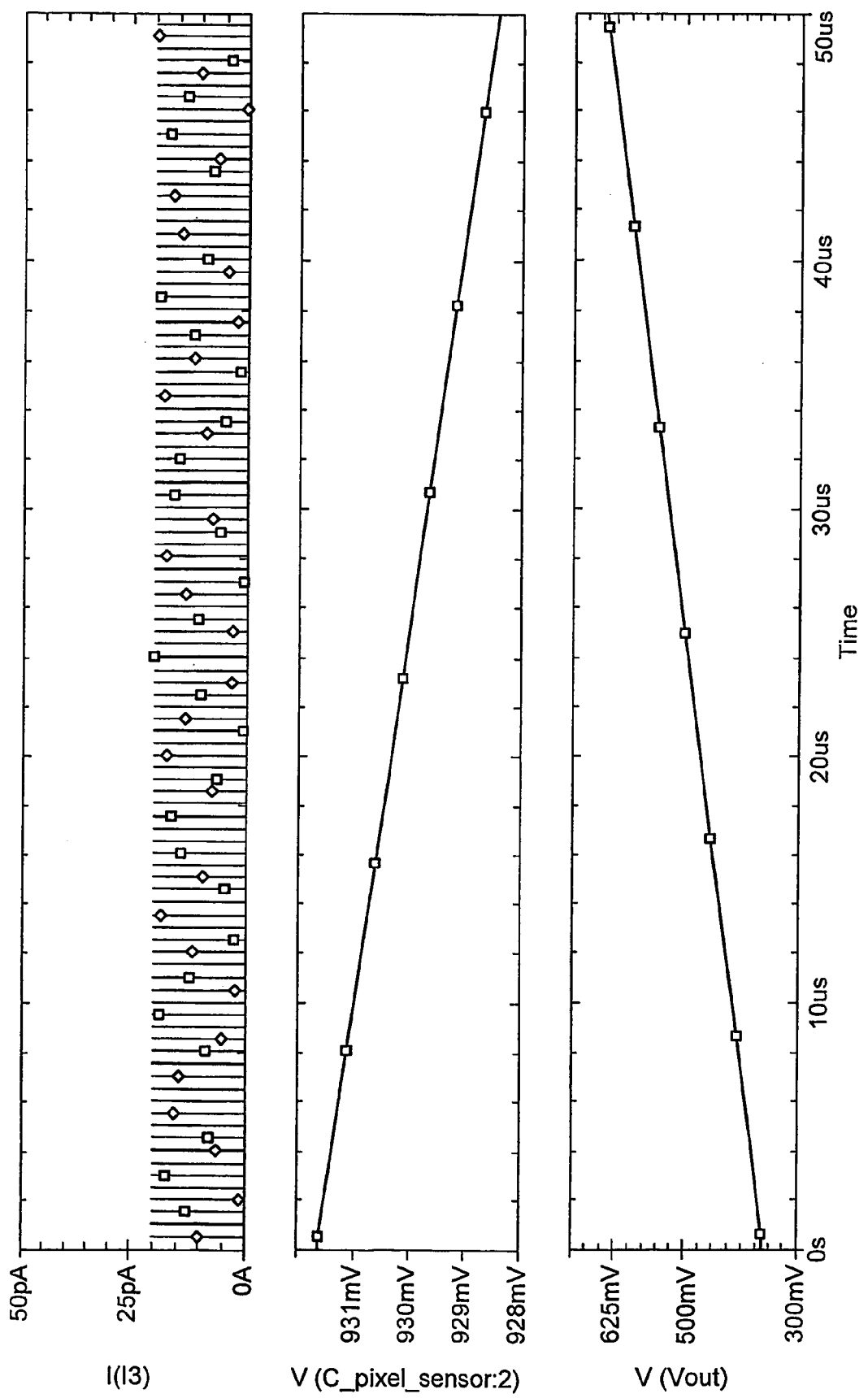
FIG. 11 is a graph of the input current, one electron every 500 ns, of the input node and of the output node of the integrating sensing device of FIG. 10.

FIG. 11 is a graph of the input current, one electron for each pulse, every 0.5 µs, to the input node and of the output node of the sensor circuitry of FIG. 10.

Figure 12:
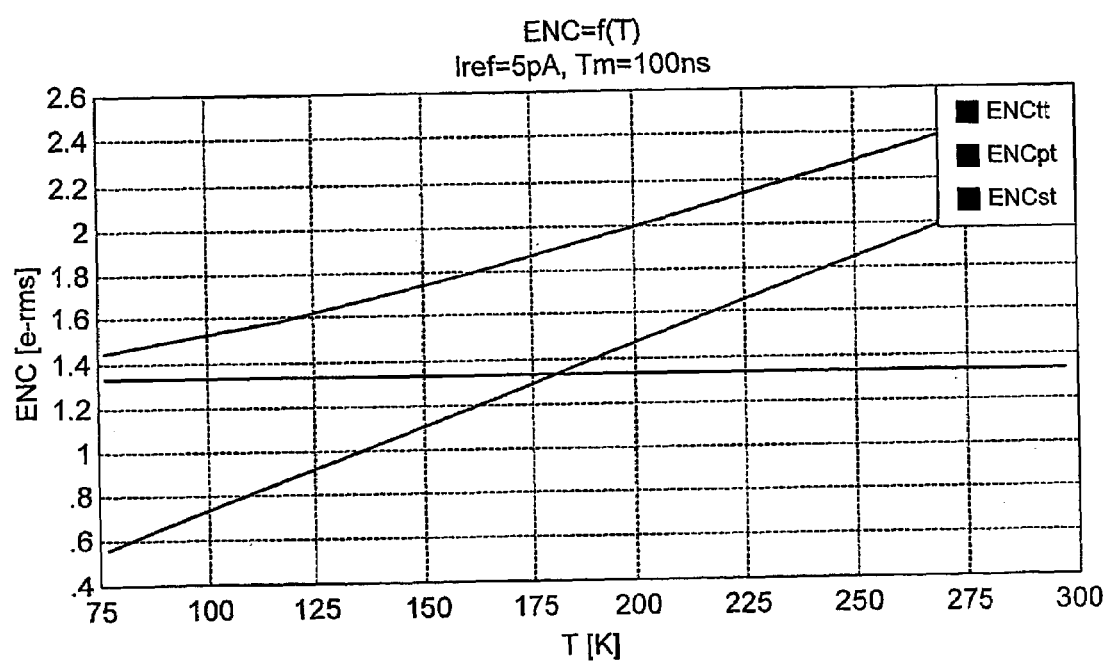
FIG. 12 is a graph of the noise (ENC) as a function of the operating temperature, from 77K to 297K of the binary sensing device, for example pixel, circuit of FIG. 3.

The operation of a sensing device of the type shown in FIGS. 2A, 3 and 10, at cryogenic temperature improves circuit performance, as illustrated in FIG. 12 which shows noise calculation as function of temperature. Cryogenic operation also improves charge collection of electrons in the silicon sensor layer by increasing the carrier velocity and the minority carrier lifetime. Such operation also increases the sensitivity of the non-linear amplifier, and improves operating conditions of avalanche photodiodes.

Figure 13:
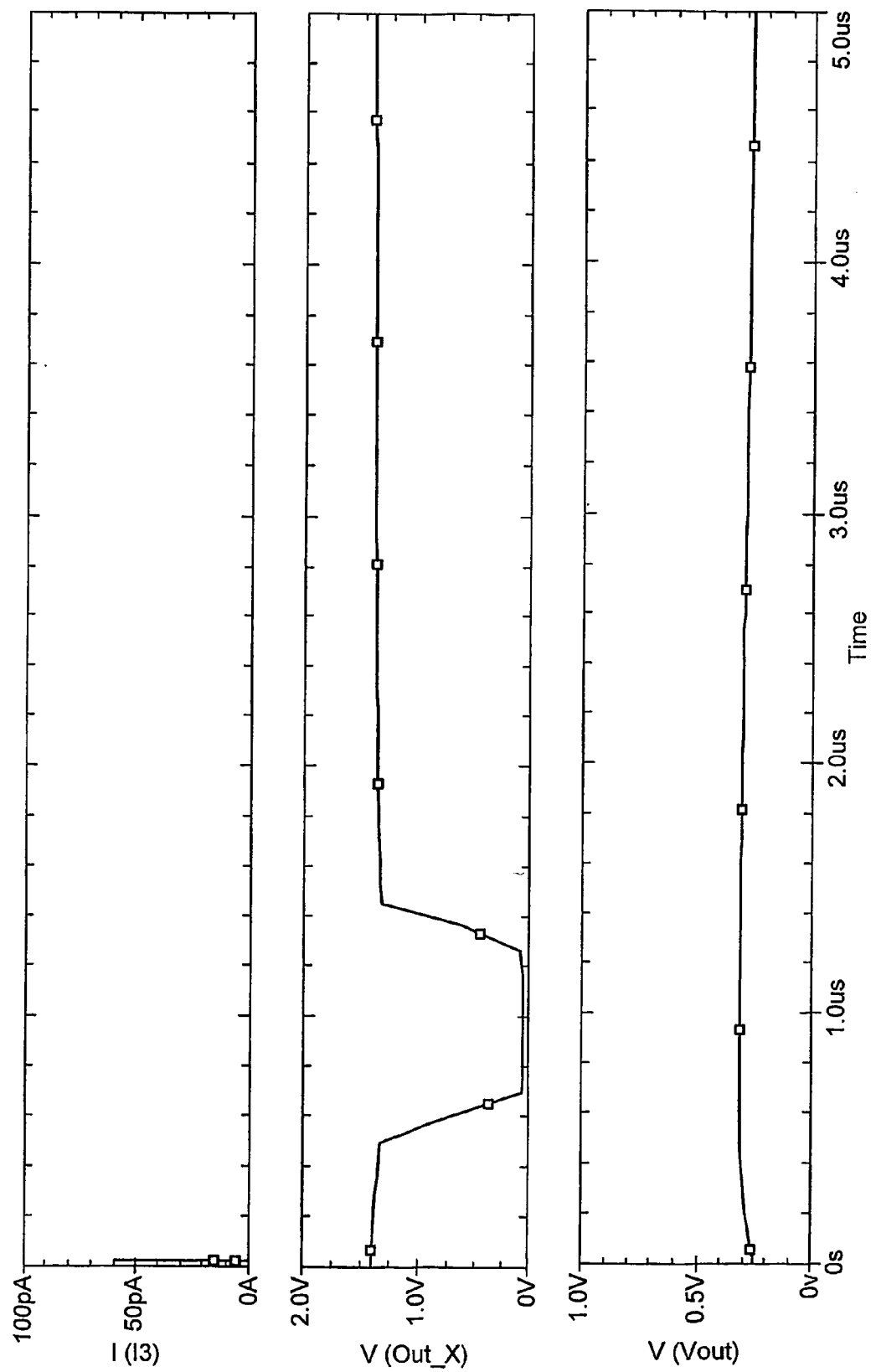
FIG. 13 is a graph of the binary sensing device circuit of FIG. 3 for 1.5 fF sensor capacitance set to detect 3 electrons charge.

FIG. 13 shows simulations of the binary pixel circuit illustrated in FIG. 3 with a 1.5 fF sensor capacitance and designed in 0.25 µm CMOS operating at liquid nitrogen temperature with a detection capability of 3 e–.

Figure 14:
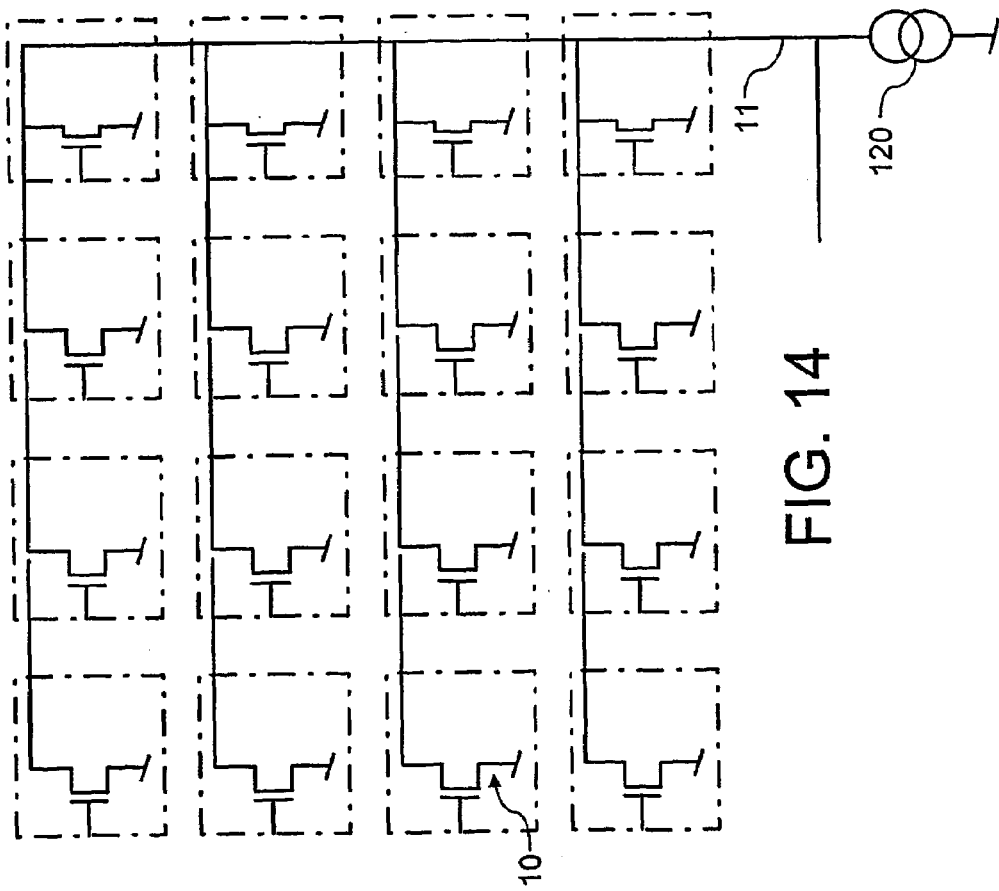
FIG. 14 is a view of a macropixel arrangement grouping together 16 pixels of the type shown in FIG. 3.

FIG. 14 shows an array of sixteen pixels 10 of the type illustrated in FIG. 3, forming a macropixel arrangement. The outputs of the plurality of pixel cells 10 are connected to a common high-speed bus 11, such as a Fast-OR bus line, to form a macro-pixel. The bus 11 also has a current source 120 to the output stages of the pixels 10.

The Fast-OR line is read out by a logic circuit that connects the OR signal to the peripheral end-of-logic column, as shown in FIG. 4.

Figure 15:
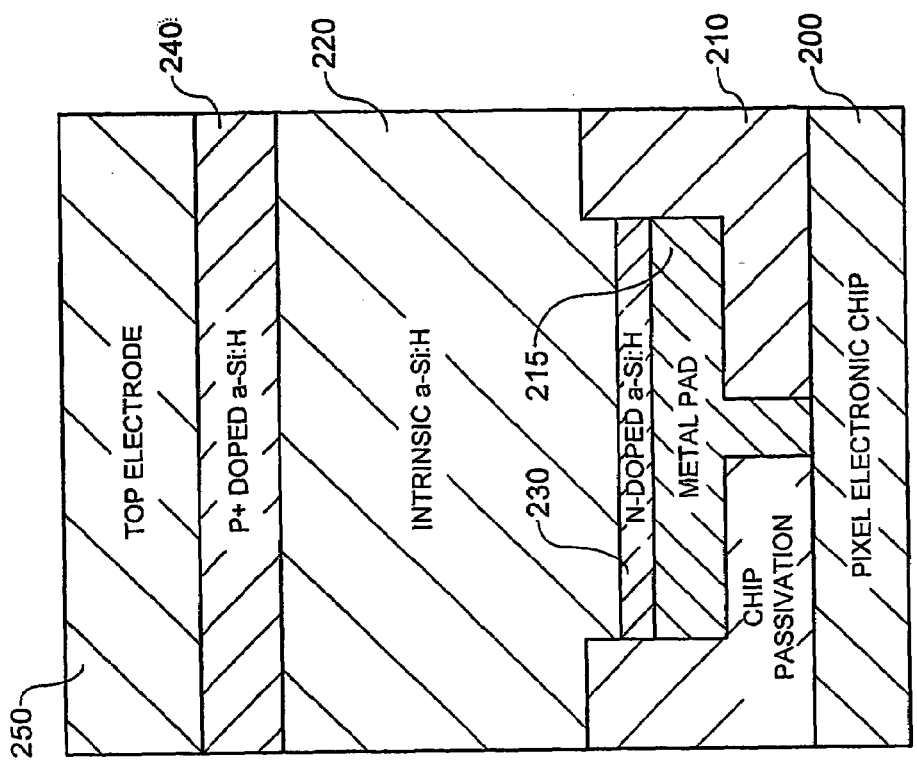
FIG. 15 is a cross-section of a sensor ASIC assembly into which the pixel of FIGS. 2A to 4, and 10 may be diffused with an amorphous Si:H PIN sensor deposited on the surface of the ASIC.

One example of a sensing device consists of pixel cells diffused into or otherwise formed on or in an ASIC silicon chip of the type shown in FIG. 15 which comprises a substrate 200 and a passivation layer 210 on which are deposited metal contacts 215. A layer 218 of n-doped amorphous hydrogenated silicon(a-Si:H) is deposited over the metal contacts 215. A layer of intrinsic a-Si:H 220 is deposited onto the n-doped a-Si:H layer 218 and preferably covers the whole substrate 200. A thin p-doped layer 240 may be diffused into the upper surface of the layer of intrinsic a-Si:H 220 and a top electrode pattern 250 is formed e.g. by deposition over the p-doped layer 240. The pattern may be common to all or at least a number of the pixels. A thickness of the a-Si:H substrate 200 is 10 to 30 µm. The ASIC assembly has the typical thickness of a silicon wafer.

In alternative embodiments, other semiconductor materials than a-Si:H are used to form the pin structure, for example high atomic number materials such as selenium, lead iodide, cadmium telluride, mercuric iodide. These materials may be directly substituted for the a-Si:H in the structure shown in FIG. 15. The detecting layer works by direct conversion and electrons are collected by the array of electrodes 215 of the ASIC and amplified and processed by the same ASIC. Use of high atomic number materials is advantageous for high energy X-ray above 5KeV, where silicon does not have enough conversion efficiency. One deposition condition of high atomic number materials is a temperature deposition below 250 C to avoid to damage the underlying ASIC. This restricts the choice of possible detecting material.

For a-Si:H PIN detecting structure, the top electrode can be of ITO where visible light is to be detected. However other electrode materials may be used where X-rays or particles are to be detected.

Yet another example of a sensor integrated on the substrate which contains readout circuitry such as the amplifier, feedback circuitry and current mirror of FIGS. 2, 3 or 10, is shown in FIG. 18. This sensor 500 is an avalanche photodiode structure on substrate 501, and consists of a p+ layer 502 over the substrate acting as anode contact, with an overlying neutral-charge depletion region 503. A p layer 505 is formed in a well in the depletion region and is surrounded above and to its sides by an n layer 506, so that the p and n layers form a pn junction. An oxide layer 508 provides a window for incoming photons, and bias is supplied via a cathode connection 520 which may be a metallisation, a polysilicon line or otherwise as known to those skilled in the art. Other APD structures, for example including rings, can be used.

Figure 16A:
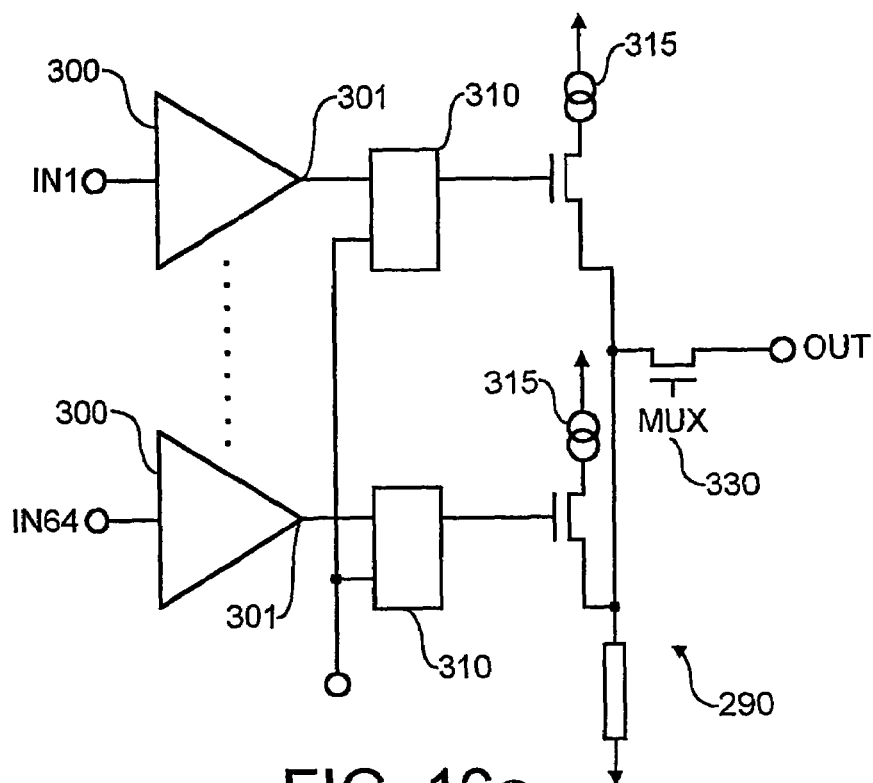
FIG. 16a is a block schematic diagram of an array of 64 pixels of the type shown in FIG. 3.
Figure 16B:
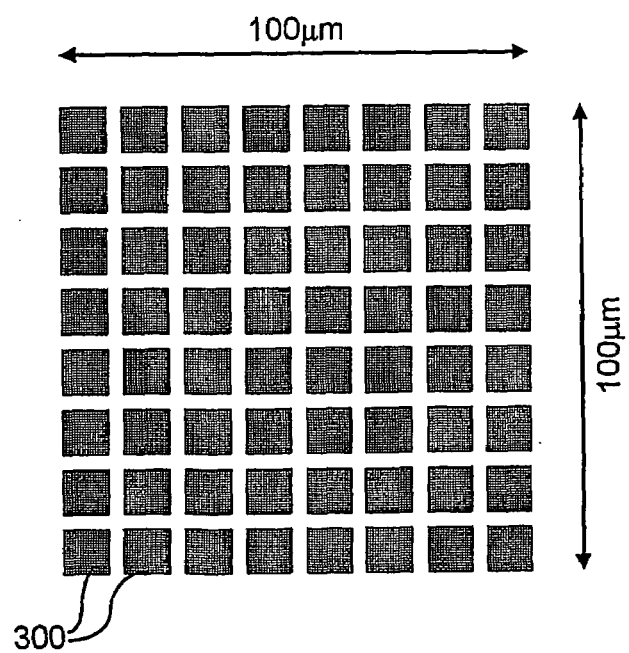
FIG. 16b is an array of 64 pixels of the type shown in FIG. 3 arranged in an 8×8 matrix and forming a macropixel that may be read out with an analogue multiplexing APS readout scheme.

In another embodiment of the invention, in which the sensing device is a pixel sensor, an array of 64 pixels of the type shown in FIG. 3 may be arranged to form a macropixel, as shown in FIGS. 16a and 16b. The macropixel 290 comprises an array of 64 pixels 300, each pixel 300 being connected to a bistable output circuit 310 which switches a current source into a common bus 320. The output of the bus 320 can then be multiplexed using a multiplexer 330 with the output of other similar arrays to build a large area detector. Once readout of the bus 320 is complete, the bistables 310 are reset.

Figure 17:
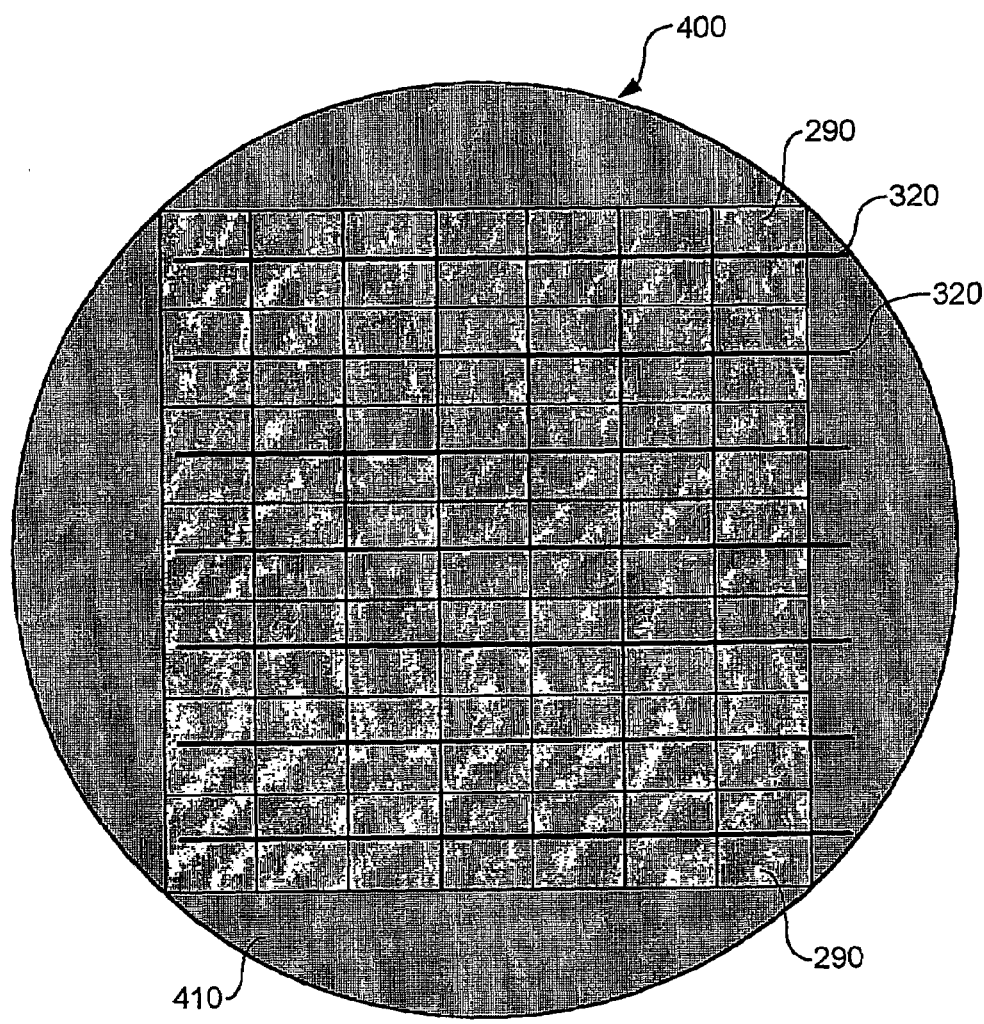
FIG. 17 is a large area sensor such as a complete wafer carrying an assembly of arrays of the type shown in FIGS. 4, 16a and 16b.

FIG. 17 shows a large area sensor 350, typically a complete wafer, carrying an assembly of arrays 300 of the type shown in FIG. 16a.

As mentioned above, in the embodiments illustrated in FIGS. 16a, 16b and 17, each pixel output 301 is connected to a separate bistable 310, one being allocated for each pixel. The output of each bistable 310 controls a current source 315 which is connected to a local bus 320 connecting the pixels 300 to form a macropixel 290. When a hit generated by an X-Ray photon occurs, the bistable state of the bistable 310 connected to the pixel which has been hit switches to 1 and turns on the associated current source 315. Then, each time a hit occurs in the macropixel area, another bistable 310 will switch on adding a current level to the macropixel bus 320. Once the readout time is over, the macropixel currents are readout as in standard analogue readout schemes of APS architecture, by analogue multiplexing. Once the readout is finished, a global reset is applied to all pixel cells which switches back to zero the current level of the macropixel bus 320, and a next readout cycle can start again.

In binary schemes, such as that shown in FIG. 4, the readout of individual pixels for pixel density of 1 million/$cm^2$ could cause serious problems. Furthermore, most of the medical applications need pixel dimensions of 50 µm to 100 µm, and not the 10 µm pixel size of the pixels embodying the invention. The Applicant has appreciated that the aggregation of arrays of pixels to form a macropixel 290 is a novel and inventive solution. The macropixel 400 illustrated in FIG. 17 is particularly useful in HEP and medical applications and comprises a plurality of arrays of macropixels 290 incorporated into a wafer 400.

Figure 1:
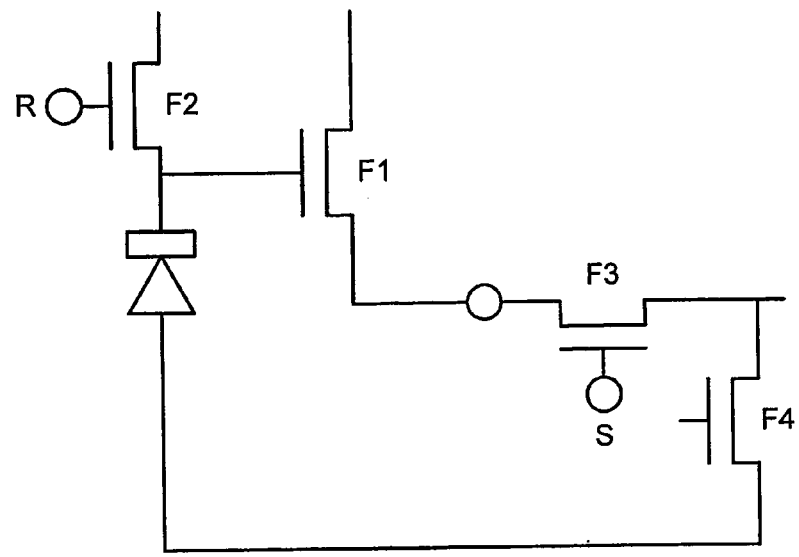
FIG. 1 is a circuit diagram illustrating the architecture of a prior art APS circuit.

An additional advantage of forming a macropixel as described above and illustrated in FIGS. 16a, 1b and 17 is that it is possible to build a large area detector that may be incorporated into a wafer 410, as shown in FIG. 17. The wafer 410 may be 8 inches in diameter with a 14 cm square detector formed by the arrays of pixels 290. In this embodiment, an interconnecting level may be added on top of the processed wafer before the amorphous Si:H deposition.

A further advantage of this embodiment is that whilst process defects may be present, which may be due to non-100% yield, they are localized in one pixel thereby killing the functioning of that pixel, but not the macropixel itself. This results only in a loss of efficiency of the device but does not affect the ability of the device to perform its function. For an aggregation of 100 pixels of 10 µm in a macropixel of 100 µm, one defect in the macropixel area of 100 µm would decrease the efficiency only by 1%. Thus, even if a pixel is faulty, the macropixel device is still operable, albeit with a slight decrease in efficiency.

While the invention has been described in detail by specific reference to various embodiments, it is understood that variations and modifications may be made without departing from the true spirit and scope of the invention. In particular, the supply voltage may be varied. Also, advances in the semiconductor industry will provide, in the future, deeper submicron technologies for which scaling rules should be applied to the invention described herein to benefit from smaller parasitic capacitance and obtain better circuit sensitivity and lower power consumption. Scaling of the very deep submicron future CMOS technologies will increase circuit sensitivity of the invention that will make possible single electron signal amplification and discrimination.

Furthermore, it will be appreciated that the values given above in the description of the embodiments are based on idealised circuit operation during computer simulation and for a given deep submicron CMOS technology, and that therefore relatively minor variations will not substantially affect the operation of the circuits illustrated in the accompanying FIGS. 2A to 4, 10 and 16a.

In summary, the present invention is applicable to the field of solid state radiation sensors, monolithic integration of active pixel sensors (APS), and more specifically to the field of imaging and Single Photon Detection and Single Particle Detection (SPD). An Active Pixel Sensor (APS) signal processing circuit is described for covering multi-electron level signals delivered by a pixel radiation sensor integrated in a monolithic integrated circuit designed with commercial deep submicron CMOS technologies. The readout circuit is an Application Specific Integrated Circuit (ASIC) that performs fast signal amplification and fast signal discrimination with a 12 MOSFET transistor 250 nW circuit cell that is associated with each pixel radiation sensor. Each pixel sensor consists either of a p-n junction built in the bulk of the silicon substrate or of a PIN diode built in a thin film of hydrogenated amorphous silicon deposited on the top of the ASIC. The readout pixel circuit provides a fast logic signal or a fast analogue signal each time a photon or a charged particle impinges on the radiation pad sensor. This is accomplished without any additional peripheral processing circuit.

Furthermore, one or more embodiments of the invention are capable of single particle detection (SPD), and effectively operate as a quantum device by detecting each incident quantum individually. The embodiments of the invention are very sensitive devices which are compact and operate at extremely low power.

A variant of the circuit works by integration as for standard APS, but with an internal pixel gain of about 1000. Several readout pixel circuits with their associated pixel sensors of typical size ranging from 5 μm×5 μm to 30 μm×30 μm can be grouped together via a single analogue or a digital bus line to form a macropixel dimensioned to fit the required space resolution and desired pixel shape. Each macropixel information, binary or analogue can be retrieved individually with a synchronous readout with addressable column logic or with asynchronous column logic, or with an analogue multiplexer like in standard CMOS APS imagers.

Having described various embodiments of this invention, it will be now apparent to one of ordinary skill in the art that other embodiments incorporating the concept may be used. Therefore, the invention should not be limited to the disclosed embodiment, but rather should be limited only by the following appended claims.

I. Glossary of Symbols kTC noise, also termed reset noise is the noise associated with the reset operation in APS circuits, CMOS imagers and CCD devices. In reference to the FIG. 1 Prior art, each time the readout cycle is completed the input sensing node of S, gate of M1 is reset by the transistor reset switch M2 to a reference voltage that is applied to the gate of M2. This operation generates a noise at the input sensing node, the gate of M1, equal to $$v_n^2 = \frac{kT}{C_{IN}},$$

where $C_{IN}$ is the input capacitance. Vn increases when $C_{IN}$ decreases. This causes serious problems in a high density APS pixel circuit. An embodiment of the present invention aims to solve this problem by aiming to eliminate reset noise.

ENC (ENCp for parallel noise ENCs for series noise): Equivalent Noise Charge, it is the r.m.s. charge usually expressed in electron r.m.s. that should be applied at the input of the amplifying channel to obtain the same output noise caused by the internal physical noise sources of this amplifying channel. The ratio of the input signal/ENC gives the signal-to-noise ratio, a basic number of the channel sensitivity.

$$U_T = \frac{kT}{q}$$

is the thermal voltage about 25.6 mV, here K is the Boltzman constant $1.381 \ 10^{-23}$ Joule/Kelvin, T is the absolute temperature in Kelvin (300K for room T), q is the electronic charge $1.602 \ 10^{-19}$ C Cox" is the unit capacitance of the gate oxide of the MOS transistor. Typically, it is 5 fF/um² for quarter micron CMOS technology used for in an embodiment of the present invention.

$C'_{ox}$ is the gate oxide capacitance per unit area of the MOS transistor. It is 5 fF/um² in the quarter micron CMOS technology used in an embodiment of the present invention. The sign "'" means a normalized unit.

n is the slope factor of the MOS transistor equal to $$n = 1 + \frac{\gamma}{2\sqrt{\Psi_o + V_p}}$$

with the surface potential $\Psi_0 \approx 2\Phi_F + 3U_T$ where $\Phi_F$ is the fermi potential, and $$\gamma = \sqrt{\frac{2q\varepsilon_{si}N_{SUB}}{C'_{OX}}}$$

where $N_{SUB}$ is the substrate doping concentration $\epsilon_{si}$ the silicon permittivity $1.04 \ 10^{-11}$ F/m, and $V_p$ is the pitch off voltage of the MOS transistor μ is the carrier mobility W is the gate width of the MOS transistor defined by design L is the gate length of the MOS transistor defined by design $C_{OUT}$ is the output capacitance of the output node of an embodiment of the present invention, at the interconnection of the input branch with the load branch.

$C_{IN}$ is the capacitance of the input sensing node $V_T$ is the threshold voltage of the MOS transistor gm (also gmf and gmi) is the transconductance of the MOS transistor, gate transconductance in weak inversion is $$gm = \frac{I_D}{nU_T},$$

source transconductance is $$gms = \frac{I_D}{U_T}$$

Tm is the pulse shaping peaking time of the amplifying channel

II. Glossary of Terms and Labeling of Components in Figures

T1 Feedback transistor in FIG. 2B
T2 Input current source in FIG. 2B
T3 Current mirror controlling T2 in FIG. 2B
T4 Discriminator transistor in FIG. 2B
M1 Input transistor in FIG. 3
M2 Feedback transistor in FIG. 3
M3 Input current source in FIG. 3
M4 Cascode transistor of the input branch in FIG. 3
M5 Load branch in FIG. 3
M6 Current mirror controlling input current source M3 in FIG. 3

M7 Cascode transistor of the output load branch in FIG. 3

M8 Discriminator transistor branch X

M9 Bias current mirror transistor of the load branch

M10 Cascode transistor branch X

M11 Discriminator transistor branch Y

M12 Cascode transistor branch Y

M13 is the output source follower transistor of FIG. 10

M14 is the output current source of FIG. 10

Pixel sensor cell 12 is the generic name for the four sensor types (a-Si:H P—I—N diode, P—N diffused junction, APD P—N diffused junction, and amorphous Selenium layer)

Input sensing node, referring to FIG. 3 Binary architecture, it consists of the common interconnection of N-electrode of the pixel sensor cell with drain of the input current source M3, gate of the input transistor M1, drain of the feedback transistor M2.

Input branch is transistors M1–M4

Load branch is transistors M5–M7

Discriminator output branch X is transistor M8–M10

Discriminator output branch Y is transistor M11–M12

$V_{REF}$ Reference Voltage in FIG. 2A, FIG. 2B and FIG. 3 defines the operating point of the output branches X and Y $I_{REF}$ is the reference current in FIG. 2A, FIG. 2B and FIG. 3

$I_{BIAS}$ is the Bias current of the bias input branch and load branch via the mirror transistor M9

$Q_{DET}$ is the input charge generated by a particle hit in the pixel sensor cell.

$I_{DO}$ is the standing current in the input branch and load branch almost equal to the bias current (mirror current).

What is claimed is:

1. A sensing arrangement having a sensor device and amplifier circuitry, the sensor device being constructed and arranged to provide a sensor signal when it receives one or more charged particles and/or one or more quanta of electromagnetic radiation, the amplifier circuitry having an input node and an output node, the sensor device being connected to said input node for supplying said signal thereto whereby a level at the output node changes, and further having feedback circuitry connecting said input node and said output node for feeding back a portion of the level at the output node for maintaining a first level at the output node in the absence of a said signal from said sensor device, the feedback device being responsive to a change in level at said output node to vary an effect of said feedback circuitry when said level changes to increase a loop gain of said amplifier circuitry.

2. The sensing arrangement of claim 1, wherein the feedback circuitry comprises a dc path and capacitive path, and a capacitance of the capacitive path reduces substantially to zero when the level at the output node is close to a threshold level.

3. The sensing arrangement of claim 1 wherein the feedback circuitry comprises a MOSFET, having a drain source path connecting said input node and said output node, said MOSFET having a gate connected to a reference potential.

4. The sensing arrangement of claim 3, wherein said amplifier circuitry is arranged to have an output node level which changes in response to a said signal sufficiently to cause a drain current of the said MOSFET to fall to zero, whereby the amplifier circuitry operates in an open-loop condition.

5. The sensing arrangement of claim 3, having an input current source constructed and arranged to apply a current to said input node of said amplifier, wherein said MOSFET is operable to provide a path from said input node to carry said current to said output node whereby said MOSFET is maintained in deep weak inversion.

6. The sensing arrangement of claim 5 wherein the current source comprises a current mirror.

7. The sensing arrangement of claim 5, in which the input current source is constructed and arranged to be controllable to a value of substantially zero to allow integration by said amplifier circuitry of sensed charge of said sensor device signal with the amplifier circuitry in open-loop condition, wherein the amplifier circuitry has a source follower output for providing an analog output.

8. The sensing arrangement of claim 3, having an output transistor having a gate connected to said output node for providing an output signal indicating detection of a said charged particle and/or electromagnetic radiation, wherein said reference voltage determines the level of said sensor signal required to provide said output signal to allow single particle detection.

9. The sensing arrangement of claim 8, wherein having a voltage potential arranged to bias the output transistor in weak inversion at a drain current of few nanoamps.

10. The sensing arrangement of claim 8, wherein the drain current increase of the output transistor is 1000 times (3 current decades) its value between around 1 nA to 1 A for an output voltage increase of the amplifier circuitry of about 250 mV.

11. The sensing arrangement of claim 1, the arrangement being integrated on a semiconductor substrate.

12. The sensing arrangement of claim 1, wherein the sensor device comprises one or more selected from the group comprising a p-n junction sensor, a p-n photodiode, an avalanche photodiode, a radiation sensor for detecting charged particles and/or X-ray photons, an amorphous Si:H PIN diode, and a high atomic number semiconductor PIN diode.

13. The sensing arrangement of claim 1, wherein the sensing arrangement is a pixel cell.

14. The sensing arrangement of claim 1 further comprising a readout circuit comprising complementary metal oxide semiconductor (CMOS) circuitry for receiving the output of the sensor device and producing an output signal corresponding to a detection event.

15. The sensing arrangement of claim 1, wherein a quantum provides an input charge to the sensor device, wherein the input charge is around 10 to 15 e– at a reference current of around 10 pA.

16. The sensing arrangement according to of claim 1, wherein an output voltage increase of about 250 mV is generated by an input charge of about 25 e–.

17. A sensing arrangement having a sensor device and amplifier circuitry, the sensor device being constructed and arranged to provide a sensor signal when it receives one or more charged particles and/or one or more quanta of electromagnetic radiation, the amplifier circuitry having an input node and an output node, the sensor device being connected to said input node for supplying said signal thereto whereby a level at the input node changes and causes an output signal from said output node, the sensor arrangement further comprising a current mirror connected to said input node and constructed and arranged to supply current thereto for restoring the level at the input node to a starting level.

18. A sensing arrangement comprising a sensor device for detecting arrival of an incident quantum of electromagnetic radiation and/or charged particles, and an amplifier connected to the sensor device for amplifying a signal from the sensor device, wherein the sensor device and the amplifier are fabricated on a common substrate, the arrangement being constructed and arranged to discriminate between arrival of single and multiple incident quanta at the sensor device.

19. A detection system comprising an array of sensing arrangements having a sensor device and amplifier circuitry, the sensor device being constructed and arranged to provide a sensor signal when it receives one or more charged particles and/or one or more quanta of electromagnetic radiation, the amplifier circuitry having an input node and an output node, the sensor device being connected to said input node for supplying said signal thereto whereby a level at the output node changes, and further having feedback circuitry connecting said input node and said output node for feeding back a portion of the level at the output node for maintaining a first level at the output node in the absence of a said signal from said sensor device, the feedback device being responsive to the change in level of said output node to vary the effect of said feedback circuitry when said level changes to increase the loop gain of said amplifier circuitry, the detection system comprising a readout circuit for receiving an output of the sensing arrangements and producing an output signal.

20. A macropixel comprising an array of sensing arrangements, each having a sensor device and amplifier circuitry, each sensor device being constructed and arranged to provide a sensor signal when it receives one or more charged particles and/or one or more quanta of electromagnetic radiation, the amplifier circuitry having an input node and an output node, the sensor device being connected to said input node for supplying said signal thereto whereby a level at the output node changes, and further having feedback circuitry connecting said input node and said output node for feeding back a portion of the level at the output node for maintaining a first level at the output node in the absence of a said signal from said sensor device, the feedback device being responsive to the chane in level of said output node to vary the effect of said feedback circuitry when said level changes to increase the loop gain of said amplifier circuitry, wherein outputs of said sensing arrangements are combined to give the effect of a larger pixel.

21. The macropixel of claim 20 wherein the outputs of the sensing arrangements are connected to a bus.

22. A method of detecting the arrival of one or more charged particles and/or one or more quanta of electromagnetic radiation using a sensing circuit comprising a sensor device, and amplifier circuitry, wherein the sensor device is connected to an input node of the amplifier circuitry and is constructed and arranged to provide a signal when it receives said one or more charged particles and/or one or more quanta of electromagnetic radiation, the method comprising:
    feeding back a portion of an output voltage at an output node of said amplifier circuitry to said input node;
    amplifying the voltage at said input of said amplifier circuitry, whereby the voltage at the output node increases; and
    in response to said increase in voltage, reducing the portion of said output voltage that is fed back to increase the loop gain of said amplifier circuitry.

23. The method of claim 22, further comprising decreasing a capacitance between said output node and said input node as the voltage at the output node increases.

24. The method of claim 22, comprising reducing said feedback to zero whereby the amplifier circuitry operates in an open-loop condition.

25. A detection system comprising an array of sensing arrangements each having a sensor device and amplifier circuitry, each sensor device being constructed and arranged to provide a sensor signal when it receives one or more charged particles and/or one or more quanta of electromagnetic radiation, the amplifier circuitry having an input node and an output node, the sensor device being connected to said input node for supplying said signal thereto whereby the level at the input node changes and causes an output signal from said output node, the arrangement further comprising a current mirror connected to said input node and constructed and arranged to supply current thereto for restoring the level at the input node to a starting level, the detection system comprising a readout circuit for receiving an output of the sensing arrangements and producing an output signal.

26. A macropixel comprising an array of sensing arrangements, each having a sensor device and amplifier circuitry, each sensor device being constructed and arranged to provide a sensor signal when it receives one or more charged particles and/or one or more quanta of electromagnetic radiation, the amplifier circuitry having an input node and an output node, the sensor device being connected to said input node for supplying said signal thereto whereby the level at the input node changes and causes an output signal from said output node, the arrangement further comprising a current mirror connected to said input node and constructed and arranged to supply current thereto for restoring the level at the input node to a starting level, wherein outputs of said sensing arrangements are combined to give the effect of a larger pixel.

27. The macropixel of claim 26 wherein the outputs of the sensing arrangements are connected to a bus.

28. A detection system comprising an array of sensing arrangements, each sensing arrangement comprising a sensor device for detecting arrival of an incident quantum of electromagnetic radiation and/or charged particles, and an amplifier connected to the sensor for amplifying a signal from the sensor, wherein the sensor and the amplifier are fabricated on a common substrate, the arrangement being constructed and arranged to discriminate between the arrival of single or multiple incident quanta at the sensor device, the detection system comprising a readout circuit for receiving an output of the sensing arrangements and producing an output signal.

29. A macropixel comprising an array of sensing arrangements, each sensing arrangements comprising a sensor device for detecting arrival of an incident quantum of electromagnetic radiation and/or charged particles, and an amplifier connected to the sensor for amplifying a signal from the sensor, wherein the sensor and the amplifier are fabricated on a common substrate, the arrangement being constructed and arranged to discriminate between the arrival of single or multiple incident quanta at the sensor device, wherein outputs of said sensing arrangements are combined to give the effect of a larger pixel.

30. The macropixel of claim 29 wherein the outputs of the sensing arrangements are connected to a bus.

* * * * *